(12) United States Patent
Sholtis et al.

(10) Patent No.: US 10,852,361 B2
(45) Date of Patent: Dec. 1, 2020

(54) TRACEABLE AND LINKABLE NETWORKING CABLE

(71) Applicant: MERTEK INDUSTRIES, LLC, Austin, TX (US)

(72) Inventors: Jon Sholtis, Austin, TX (US); Christopher B. Scherer, Austin, TX (US); Braon Mosely, Austin, TX (US)

(73) Assignee: MERTEK INDUSTRIES, LLC, Austin, TX (US)

( * ) Notice: Subject to any disclaimer, the term of this patent is extended or adjusted under 35 U.S.C. 154(b) by 0 days.

(21) Appl. No.: 16/310,353

(22) PCT Filed: Jun. 14, 2017

(86) PCT No.: PCT/IB2017/053533
§ 371 (c)(1),
(2) Date: Dec. 14, 2018

(87) PCT Pub. No.: WO2017/216741
PCT Pub. Date: Dec. 21, 2017

(65) Prior Publication Data
US 2019/0257873 A1    Aug. 22, 2019

Related U.S. Application Data

(60) Provisional application No. 62/351,141, filed on Jun. 16, 2016.

(51) Int. Cl.
*G08B 21/00* (2006.01)
*G01R 31/58* (2020.01)
(Continued)

(52) U.S. Cl.
CPC ............. *G01R 31/58* (2020.01); *G01R 31/44* (2013.01); *G01R 31/66* (2020.01);
(Continued)

(58) Field of Classification Search
CPC ........ G01R 31/58; G01R 31/66; G01R 31/44; H01R 13/6658; H01R 13/70; H01R 24/64; H04Q 1/136; H04Q 1/00; H04B 10/808
(Continued)

(56) References Cited

U.S. PATENT DOCUMENTS 6,577,243 B1    6/2003    Dannenmann et al.
7,221,284 B2    5/2007    Scherer et al.
(Continued)

OTHER PUBLICATIONS

International Search Report and Written Opinion issued in International Patent Application No. PCT/IB2017/053533, dated Sep. 25, 2017.

*Primary Examiner* — Tanmay K Shah
(74) *Attorney, Agent, or Firm* — Norton Rose Fulbright US LLP

(57) ABSTRACT

Disclosed are traceable (e.g., networking) cables and cable components (e.g., telltales, switches, and controllers). The disclosed networking cables may be (e.g., indirectly) connected such that signals may be communicated from one cable to another cable. For example, some such cables are configured such that when a switch of one cable is actuated, a controller connected to the switch sends signals to other controllers of the same cable and controllers of other connected cables to activate, inactivate, and/or change the operating mode of telltale(s) of the same cable and/or of other connected cables.

20 Claims, 21 Drawing Sheets

(51) Int. Cl.
    *H01R 13/70*     (2006.01)
    *H01R 24/64*     (2011.01)
    *H04B 10/80*     (2013.01)
    *H01R 13/66*     (2006.01)
    *H04Q 1/02*     (2006.01)
    *G01R 31/44*     (2020.01)
    *H04Q 1/00*     (2006.01)
    *G01R 31/66*     (2020.01)

(52) U.S. Cl.
    CPC ......... *H01R 13/6658* (2013.01); *H01R 13/70* (2013.01); *H01R 24/64* (2013.01); *H04B 10/808* (2013.01); *H04Q 1/00* (2013.01); *H04Q 1/136* (2013.01)

(58) Field of Classification Search
    USPC ....................................................... 340/635
    See application file for complete search history.

(56) References Cited

U.S. PATENT DOCUMENTS

| | | | |
|---|---|---|---|
| 8,624,577 B2* | 1/2014 | Bradley, II | H04L 43/0811 |
| | | | 324/66 |
| 8,692,683 B2 | 4/2014 | Dove | |
| 2007/0296391 A1* | 12/2007 | Bertin | G01R 19/0092 |
| | | | 323/303 |
| 2014/0313042 A1 | 10/2014 | Scherer et al. | |
| 2015/0340818 A1* | 11/2015 | Scherer | H01R 13/641 |
| | | | 307/125 |

* cited by examiner

US 10,852,361 B2

TRACEABLE AND LINKABLE NETWORKING CABLE

CROSS-REFERENCE TO RELATED APPLICATIONS

This application is a national phase under 35 U.S.C. § 371 of International Application No. PCT/IB2017/053533, filed Jun. 14, 2017, which claims the benefit of U.S. Provisional Patent Application No. 62/351,141, filed Jun. 16, 2016, the entire contents of each of which are hereby incorporated by reference in their entirety.

FIELD OF INVENTION

The present invention relates generally to cables, and more particularly, but not by way of limitation, to field-terminable traceable and linkable (e.g., networking) cables.

BACKGROUND

Examples of traceable networking cables are disclosed in U.S. Pat. Nos. 7,221,284, and 6,577,243. One example of a traceable power-over-Ethernet (POE) networking cable is disclosed in U.S. Patent Application Publication No. US 2014/0313042.

SUMMARY

This disclosure includes embodiments of traceable and linkable (e.g., networking) cables and cable components (e.g., telltales, controllers, switches, and connection hoods), and related systems and methods.

Some embodiments of the present cables comprise: a first end and a second end, and two or more conductors in a flexible sheath between the first and the second end; a first connector hood on the first end; a second connector hood on the second end; an electrically activated telltale incorporated into at least one of the connector hoods; and a manually operated switch incorporated into at least one of the connector hoods; where the cable is configured to electrically connect to an additional cable comprising an additional electrically activated telltale; and where the switch is configured to activate the telltale and the additional telltale of the additional cable by initiating communications between an electric power source, at least one of the two or more conductors, and the telltale.

Some embodiments of the present cables comprise: a first end and a second end, and two or more conductors in a flexible sheath between the first and the second end; a first connector hood on the first end; a second connector hood on the second end; an electrically activated telltale incorporated into at least one of the connector hoods; a manually operated switch incorporated into at least one of the connector hoods and configured to activate the telltale by initiating communications between an external electric power source, at least one of the two or more conductors, and the telltale; and a circuit incorporated into at least one of the connector hoods and configured to maintain a power connection between the power source and the telltale after the telltale is activated, where the circuit comprises at least a resistor and a transistor.

Some embodiments of the present cables comprise: a first end and a second end, and two or more conductors in a flexible sheath between the first and the second end; a first connector hood on the first end; a second connector hood on the second end; an electrically activated telltale incorporated into at least one of the connector hoods; a manually operated switch incorporated into at least one of the connector hoods; and a power-over-Ethernet (POE) circuit configured to be incorporated into at least one of the connector hoods; where the cable is configured to electrically connect to an additional cable and to a POE power sourcing equipment (PSE), the additional cable comprising an additional electrically activated telltale; and where the POE circuit is configured to request power from the POE PSE to activate the telltale and the additional telltale of the additional cable when the switch is actuated.

Some embodiments of the present cables comprise: a first end and a second end, and two or more conductors in a flexible sheath between the first and the second end; a first connector hood on the first end; a second connector hood on the second end; an electrically activated telltale incorporated into at least one of the connector hoods; a manually operated switch incorporated into at least one of the connector hoods; and a controller incorporated into at least one of the connector hoods; where the cable is configured to electrically connect to an additional cable having an additional electrically activated telltale; and where the controller is configured to: operate the cable in a first mode when the switch is actuated and cause the cable to send a signal to the additional cable to activate the additional telltale of the additional cable; and operate the cable in a second mode when the cable receives a signal from the additional cable to activate the telltale of the cable.

Some embodiments of the present system comprise: an embodiment of the present cables; and an electric power source (e.g., POE PSE). Some embodiments of the present systems comprise a first one of the present cables; a second cable having an additional electrical telltale (e.g., the second cable may be an embodiment of the present cables, of the same or a different embodiment than the first cable); where the first cable is configured to electrically connect to the second cable; and where the switch of the first cable is configured to activate the telltale of the first cable and the additional telltale of the second cable by initiating communications between the electric power source, at least one of the two or more conductors, and the telltales.

Some embodiments of the present methods comprise: connecting an embodiment of the present cables to an electric power source and to an additional cable comprising an additional electrically activated telltale; and operating the switch of the first cable to activate the telltale and the additional telltale of the additional cable by initiating communications between the electric power source and the telltales. Some embodiments further comprise operating the switch of the first cable to inactivate the telltale and the additional telltale of the additional cable by initiating communications between the electric power source and the telltales.

In some embodiments of the present methods of making a cable, the method comprises: providing a cable with a first end, a second end, and two or more conductors in a flexible sheath between the first and the second end; providing a first connector hood on the first end; providing a second connector hood on the second end; incorporating an electrically activated telltale into at least one of the connector hoods; and incorporating a manually operated switch into at least one of the connector hoods.

In some embodiments of the present methods of making a cable, the cable is configured to electrically connect to an additional cable comprising an additional electrically activated telltale; and the switch is configured to activate the telltale and the additional telltale of the additional cable by initiating communications between an electric power source, at least one of the two or more conductors, and the telltale.

In some embodiments of the present methods of making a cable, the manually operated switch is configured to activate the telltale by initiating communication between an electric power source, at least one of the two or more conductors, and the telltale; and the method further comprises: incorporating a circuit into at least one of the connector hoods, the circuit configured to maintain a power connection between the power source and the telltale after the telltale is activated, where the circuit comprises at least a resistor and a transistor.

Any embodiment of any of the present cables, systems, apparatuses, and methods can consist of or consist essentially of—rather than comprise/include/contain/have—any of the described steps, elements, and/or features. Thus, in any of the claims, the term "consisting of" or "consisting essentially of" can be substituted for any of the open-ended linking verbs recited above, in order to change the scope of a given claim from what it would otherwise be using the open-ended linking verb.

Details associated with the embodiments described above and others are presented below.

BRIEF DESCRIPTION OF THE DRAWINGS

The following drawings illustrate by way of example and not limitation. For the sake of brevity and clarity, every feature of a given structure is not always labeled in every figure in which that structure appears. Identical reference numbers do not necessarily indicate an identical structure. Rather, the same reference number may be used to indicate a similar feature or a feature with similar functionality, as may non-identical reference numbers. The figures are drawn to scale (unless otherwise noted), meaning the sizes of the depicted elements are accurate relative to each other for at least the embodiment depicted in the figures.

DESCRIPTION OF ILLUSTRATIVE EMBODIMENTS

The term "coupled" is defined as connected, although not necessarily directly, and not necessarily mechanically; two items that are "coupled" may be unitary with each other. The terms "a" and "an" are defined as one or more unless this disclosure explicitly requires otherwise. The term "substantially" is defined as largely but not necessarily wholly what is specified (and includes what is specified; e.g., substantially 90 degrees includes 90 degrees and substantially parallel includes parallel), as understood by a person of ordinary skill in the art. In any disclosed embodiment, the terms "substantially," "approximately," and "about" may be substituted with "within [a percentage] of" what is specified, where the percentage includes 0.1, 1, 5, and 10 percent.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system or apparatus that "comprises," "has," "includes" or "contains" one or more elements possesses those one or more elements, but is not limited to possessing only those elements. Likewise, a method that "comprises," "has," "includes" or "contains" one or more steps possesses those one or more steps, but is not limited to possessing only those one or more steps.

Further, a structure (e.g., a component of an apparatus, such as a cable) that is configured in a certain way is configured in at least that way, but it can also be configured in other ways than those specifically described.

Figure 1:
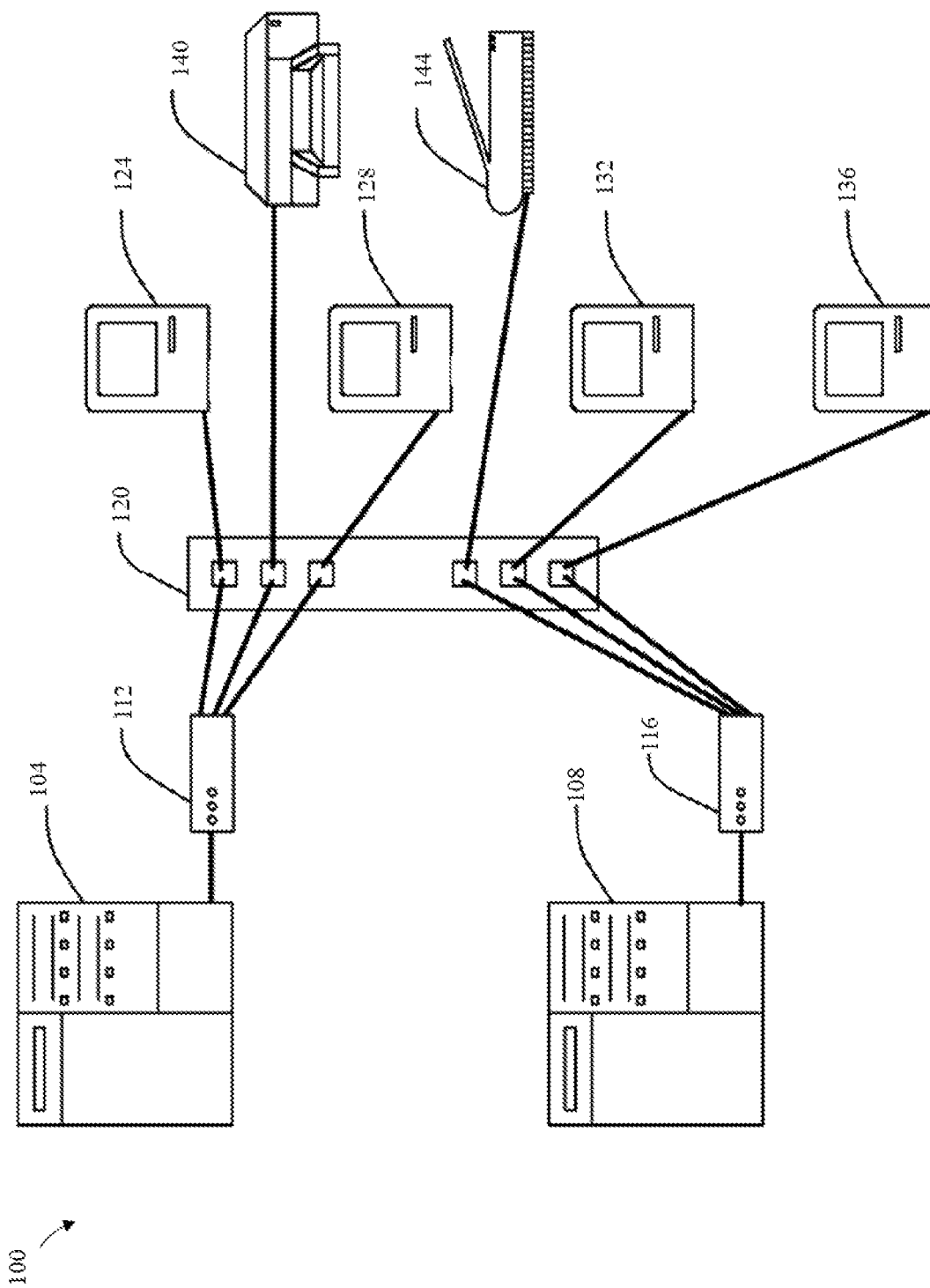
FIG. 1 illustrates a schematic view of a networked computer environment.

FIG. 1 illustrates an example of a networked environment 100 that includes servers, computers, hubs, peripheral devices, and a cable panel. In the example, shown computers 124, 128, 132, and 136 are each connected by networking cables to a cable panel 120. The computers can be at multiple locations. Also attached to panel 120 by networking cables are peripheral devices such as printer 140 and scanner 144. Panel 120 is often located at a central room where service personnel can access it. From panel 120, multiple computers and peripheral devices are often linked by networked cables to hubs such as 112 and 116, which may be connected to servers 104 and 108. Multiple servers and hubs may be housed in a room. Various protocols (e.g., Ethernet) can be used to support data transfer between computers and servers. The example shown is relatively a small network, and networks may often be much larger. In addition to the devices shown in FIG. 1, networks can include, for example, other electronic devices such as workstations, switches, tape drives, storage devices, telephone switches, VOIP devices, routers, and/or any other device that may be connected to a network (e.g., a camera). With large networks, the total number of networking cables may be very large, and routine maintenance functions (e.g., the addition or change of computers) can require significant time and manpower to trace connections throughout the network.

In some embodiments, panel 120 may also represent an external power source that provides power to the various devices (e.g., 124, 128, 132, 136, 140, 144), and at least some of the cables extending between the various devices and panel 120 may comprise power cables (e.g., AC power cables).

Figure 2A:
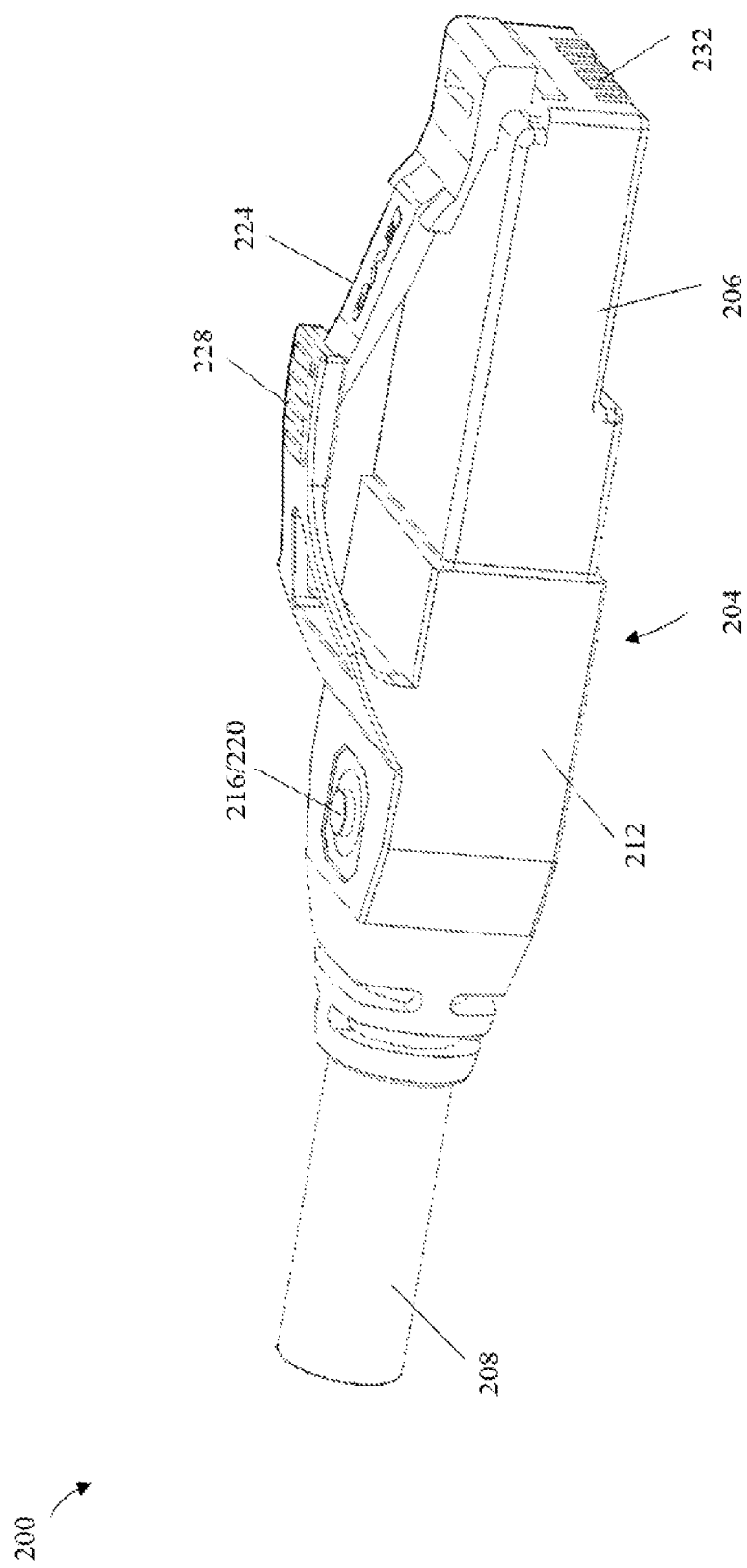
FIG. 2A illustrates a top/side view of one end of a networking cable according to one aspect of the present disclosure.
Figure 2B:
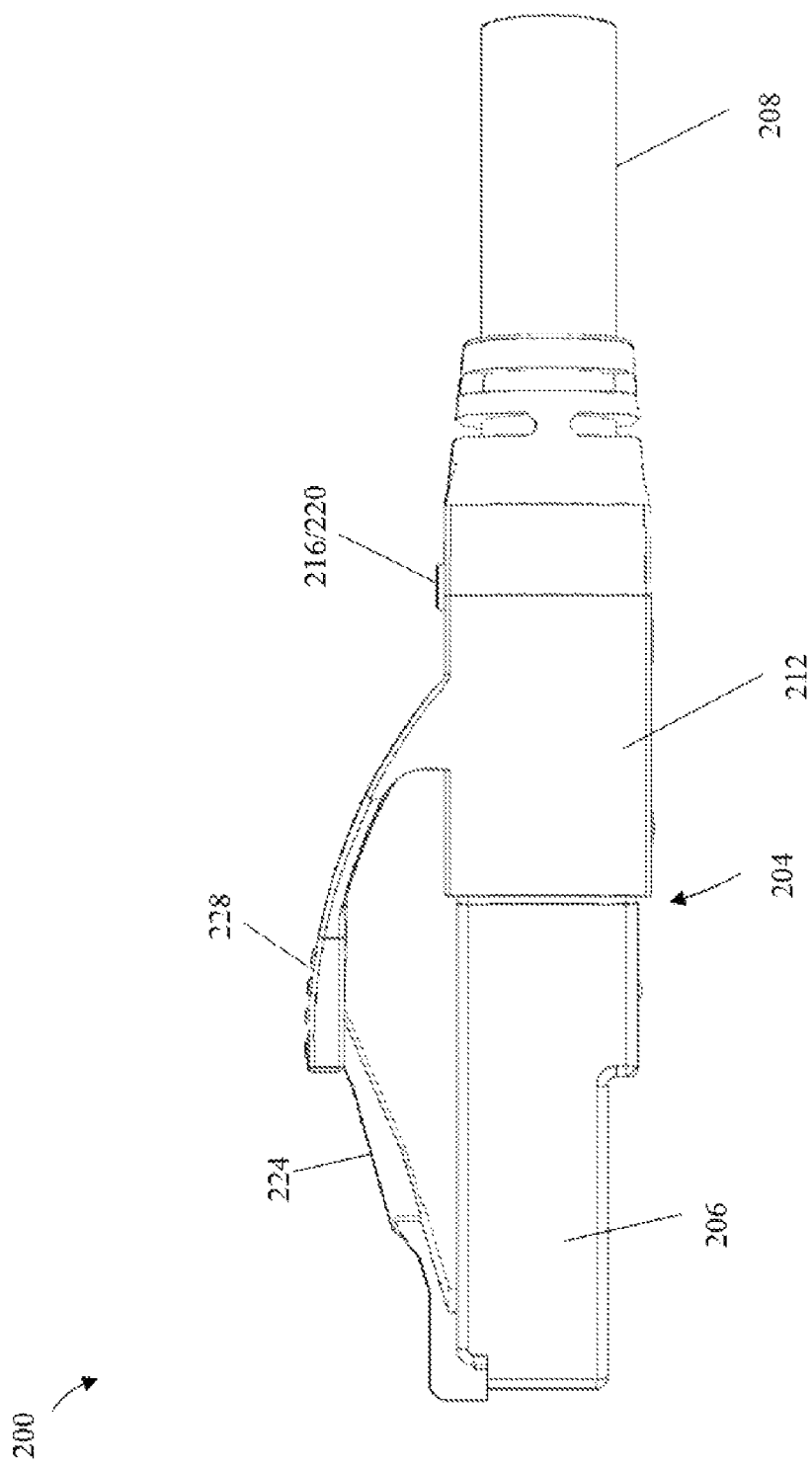
FIG. 2B illustrates a side view of one end of a networking cable according to one aspect of the present disclosure.

FIGS. 2A and 2B depict an embodiment of a networking cable 200 that may be used in the networked environment of FIG. 1. FIG. 2A depicts an angled-side view of networking cable 200 and FIG. 2B depicts a side view of networking cable 200. Networking cable 200 typically comprises a plurality of insulated twisted conductor wire pairs (not shown in the figures) encased in a flexible outer sheath (e.g., an outer cover sheath). The number of twisted conductor wire pairs (e.g., four conductor pairs with eight conductor wires, five conductor pairs with then conductor wires, etc.) can vary depending on the application (e.g., compliance with various Ethernet cable standard, such as category 3, 5A, 5E, 6, or 6A Ethernet cable standard, or other Ethernet cable standard developed in the future). In the embodiment shown, a connector assembly or hood 204 comprises a connector 206 coupled to a boot or housing 212, and connector hood 204 is coupled to an end of cable 208. Networking cable 200 may comprise another connector hood (which may or may not be the same as connector hood 204) on the other end of the cable.

An example of a typical connector 206 used for Ethernet networking applications is an RJ-45 or 8P8C connector, an eight-wire or eight-pin connector commonly used in networking computers. Another example of a connector 206 that may be used is an RJ-50 or 10P10C connector, a ten-conductor or ten-pin connector. Boot 212 may, for example, be over-molded onto connector 206 and/or cable 208. The overall connector (connector or plug, and boot) will be referred to as the connector or connection hood in this description and in the appended claims.

Some well known standards for networking cables that may be included in cable 208 include Categories: 5 (which generally includes four insulated twisted copper wires encased in a flexible outer jacket layer), 5A, 5E, 6 (e.g., for Gigabit Ethernet and/or other network protocols), 6A (which operates at higher frequencies than Cat-6 cable and has better performance in reducing crosstalk), and 7 (which is a fully shielded cable that supports speeds of up to 10 Gbps). Later standards (e.g., Cat-7 and Cat-6) are often backward compatible with earlier standards (e.g., Cat-5, Cat-3). Relative to Cat-5, Cat-6 specifications are generally more stringent for crosstalk and system noise. Cat-6, for example, provides performance of up to 250 MHz, and may be suitable for 10BASE-T, 100BASE-TX (Fast Ethernet), 1000BASE-T/1000BASE-TX (Gigabit Ethernet) and 10GBASE-T (10-Gigabit Ethernet). Cat-6 has a relatively lower maximum length when used for 10GBASE-T. Cat-6A cable, or Augmented Cat-6, is characterized for 500 MHz and has further improved alien crosstalk characteristics, allowing 10GBASE-T to be run for the same maximum cable length as other protocols. Several other standards are in use, and may be used in embodiments of the present traceable networking cables.

In some embodiments, cable 208 may comprise shielded twisted pairs (STP) (e.g., 4 pairs for typical Ethernet cables). Shielded twisted-pair cables encase each pair of signal-carrying conductor wires in a conducting shield as a means of reducing the potential for electromagnetic interference. Cable 208 may also comprise screened twisted pairs (ScTP), where multiple conductor wires are encased in a common shield. Unshielded twisted pairs (UTP) may also be used in cable 208 in some embodiments. In some embodiments, cable 208 may use any combination of the shielding mechanisms, such as screened STP, screened UTP, etc. Further, cables, conductor wires, conductor wire pairs, and/or conductors in the present disclosure may be coaxial, twin-axial, twisted, untwisted, shielded, unshielded, screened, unscreened, and/or bonded, as is known in the art.

Conductors included in cable 208 may be coded in different colors. For example, an Ethernet cable complaint with the category 6 standard has eight conductors arranged in four pairs, each with a different color pattern (e.g., orange/white strip, orange solid, green/white strip, blue solid, blue/white strip, green solid, brown/white stripe, and brown solid).

In some embodiments, networking cable 200 may comprise an electrically activated telltale or signal indicator 216. Telltale 216 may be a device configured to produce a visual and/or audio signal when activated. As used in this disclosure and the claims, an electrically activated telltale is any electrically triggered device that emits a visual or audio signal that can be detected by a human. One example of a suitable telltale is a light emitting diode (LED), but may alternatively or additionally include one or more other visual indicators (e.g., an incandescent or conventional light bulb, a liquid crystal visual indicator, etc.). Another example of telltale is a sound emitting device, such as a beep device.

In the embodiment shown, networking cable 200 also comprise a manually operated button 220 that is configured to be manually pressed to engage a manual switch incorporated into at least one of the connector hoods and configured to activate telltale 216 by initiating electrical communication between an electric power source and telltale 216 (e.g., via one or more of the conductors, such as, for example, a conductor wire, a conductor wire pair, an indicator wire, and/or indicator wire pair). For example, the switch can complete an indicator circuit that includes an LED to cause the LED to flash repeatedly for a predetermined time. In some embodiments, the indicator circuit includes the indicator wire or wire pair that runs the complete length of the networking cable.

Button 220 may be operated in different manners to send different input signals to telltale 216 and accordingly operate telltale 216 in different manners. For example, when telltale 216 is inactive, pressing button 220 once will cause telltale 216 to operate in a first manner (e.g., to light up in a first color, or blink in a first pattern, or the combination thereof), pressing and hold button 220 will cause telltale 216 to operate in a second manner (e.g., to light up in a second color, or blink in a second pattern, or the combination thereof), and/or pressing and holding button 220 will cause telltale 216 to operate in a third manner (e.g., to light up in a third color, or blink in a third pattern, or the combination thereof). When telltale 216 is active, pressing button 220 will inactivate telltale 216, or cause telltale 216 to operate in a different manner.

Generally, telltale 216 and/or button 220 are incorporated into/onto one of the connector hoods (e.g., connector hood 204) of networking cable 200. In the embodiment shown, telltale 216 is incorporated into a rear or proximal end of boot 212 near cable 208. Telltale 216 and button 220 are shown in one suitable configuration relative to connector hood 204; in other embodiments, telltale 216 and/or button 220 can be incorporated into hood at any suitable position in or on connector hood 204. In the embodiment shown, telltale 216 and switch 220 are assembled together (e.g., one is on top of another) and appears to be an integrated unit. Alternatively, telltale 216 and switch 220 may be positioned separately on a surface of connector 204, or positioned on different surfaces of connector 204. In other embodiments, networking cable 200 can include connector hoods spaced apart from the terminal or end connectors of the cable. For example, some embodiments of the networking cables can include a connector hood spaced inward relative to an end of the cable (e.g., by 1, 2, 3, 4, 5, or more inches), and the inwardly-spaced connector hood can include one or more of the tracing features or elements (e.g., a button, telltale, etc.) described in this disclosure.

Networking cable 200 may be complaint with power-over-Ethernet (POE) standards or technical specifications (such as IEEE 802.3af, IEEE 802.3.at, Cisco Inline Power, etc.), and configured to draw power from a POE power sourcing equipment (PSE). The power drawn from a POE PSE may be consumed wholly or partly by the networking cable 200 (e.g., by telltale 216) and/or an external powered device (PD). Networking cable 200 may comprise a circuit (not shown in FIG. 2A or 2B) incorporated into/onto any of the connector hoods (e.g., connector hood 204). The circuit may comprise components that carry out the functions logic control, power regulation, signal communication, etc. Networking cable 200 may also be connected to one or more cables that are substantially similar to networking cable 200, and may also be configured to communicate electric signals with other cables connected to it using the circuit. Details of the circuit will be described below in connection with FIG. 7 below and figures following FIG. 7.

In some embodiments, networking cable 200 may comprise a locking latch 224. Locking latch 224 may be molded on to connector 206 or may be an independent unit coupled to connector 206 using an attaching mechanism (e.g., latch 224 may be secured on to connector 206 using a lock-in design). Connector hood 204 may also comprise an additional latch 228 molded onto or coupled to boot 212. Latch 228 may be position to point to a direction opposing to latch 224 such that to tips of latches 224 and 228 touch each other. The tip of latch 228 may be placed on top of the tip of 224 in a unstressed condition. When networking cable 200 is connected to a port of another device (e.g., a computer, server, switch, hub, etc.) through connector 206, latch 224 is pressed down toward a top surface of connector 206, and then released to lock connector 206 in the port. Latch 228 constrains the movement of the tip of latch 224 to protect latch 224 from breaking.

Figure 3:
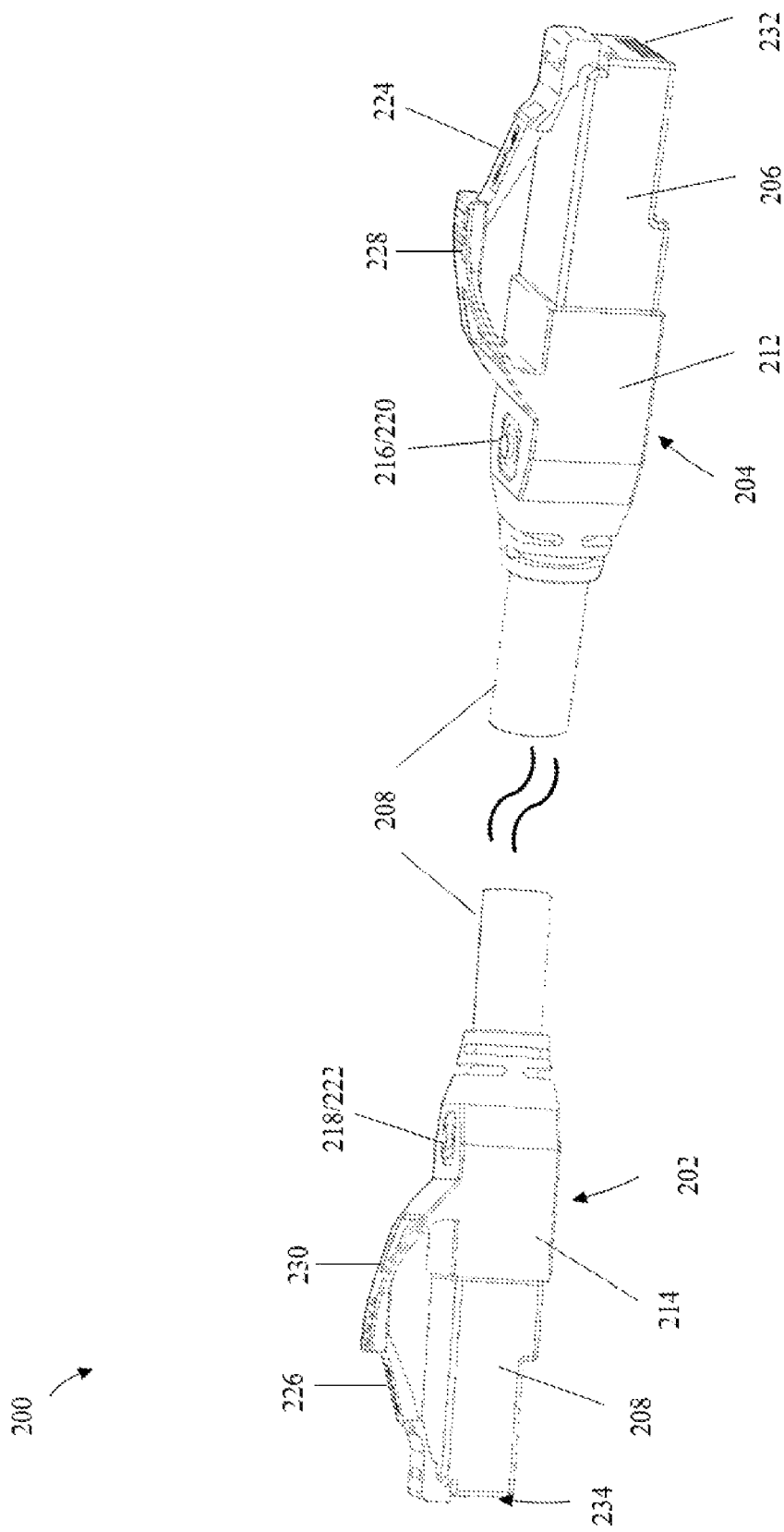
FIG. 3 illustrates a networking cable with two ends connected by one or more conductors according to one aspect of the present disclosure.

FIG. 3 shows that, in some embodiments, networking cable 200 may include hood 204 shown in FIGS. 2A and 2B, on a first or "right" end of the networking cable, and a second hood 202 (e.g., substantially similar to hood 204) on the second or "left" end of the cable (e.g., such that the two hoods are in electrical communication connection via a conductor wire, a conductor wire pair, an indicator wire, and/or indicator wire pair), as is shown in. For example, in an embodiment with a connector hood at each end of the cable, where each connector hood includes a switch and a telltale, the operation of either switch can activate both telltales if the telltales are not activated, or the operation of either switch can deactivate both telltales if the telltales are activated, as described in more detail below.

Figure 4:
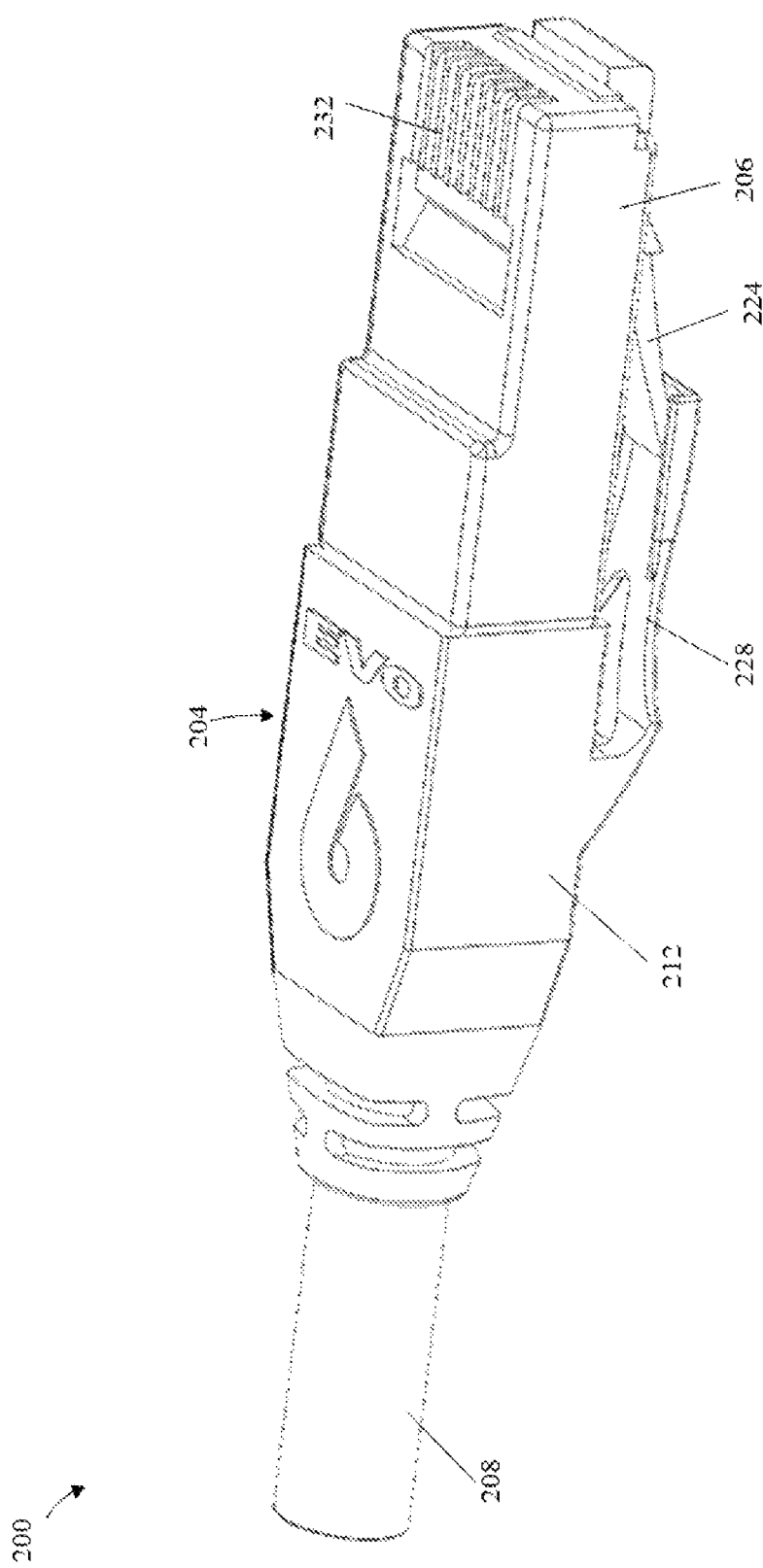
FIG. 4 illustrates a bottom view of one end of a networking cable according to one aspect of the present disclosure.
Figure 5:
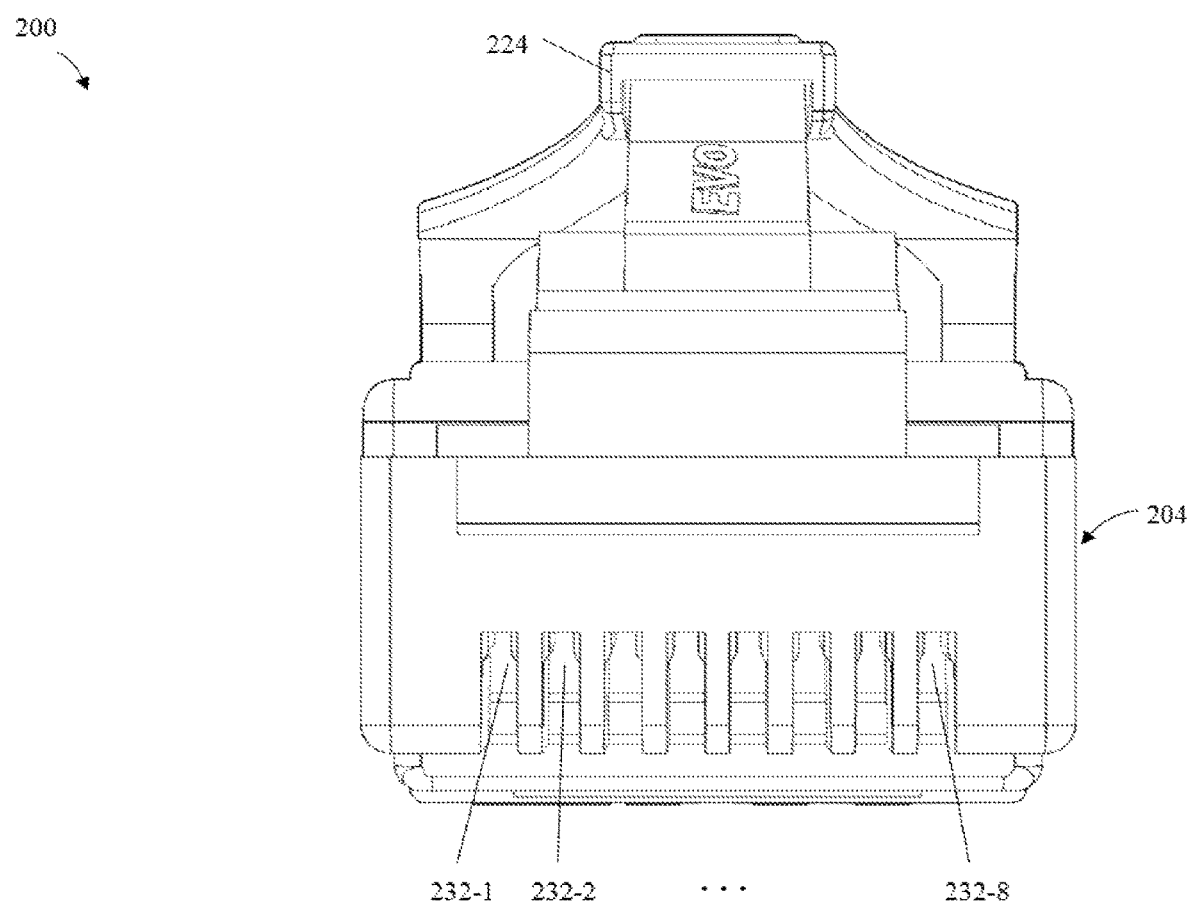
FIG. 5 illustrates a front view of one end of a networking cable according to one aspect of the present disclosure.

Referring now to FIGS. 4 and 5, FIG. 4 depicts a perspective view showing another side of an embodiment of networking cable 200, and FIG. 5 depicts an end view of the cable. As shown in FIG. 4, networking cable 200 comprises a plurality of contact pins 232 incorporated into connector 206 of connector hood 204. Each pin may be electrically connected to a conductor wire of cable 208. When networking cable 200 is connected to another device or cable through connector 206, pins 232 will be electrically in contact with the other device or cable. In the embodiment shown in FIG. 5, networking cable 200 comprises eight pins, from 232-1 to 232-8, each connected to a conductor wire of cable 208. In some embodiments, conductor wires of cable 208 may be coded with different colors and these color-coded wires may be electrically connected to pins in a specified order. For example, if networking cable 200 is a category 6 complaint Ethernet cable, pins 231-1 to 232-8 may be connected to conductor wires with the following color codes using the T568B pin assignment: orange/white strip, orange solid, green/white strip, blue solid, blue/white strip, green solid, brown/white stripe, and brown solid, respectively. Alternatively, pins 231-1 to 232-8 may be connected to conductor wires in a different order according to other pin assignment specifications of Ethernet cable standards.

Figure 6:
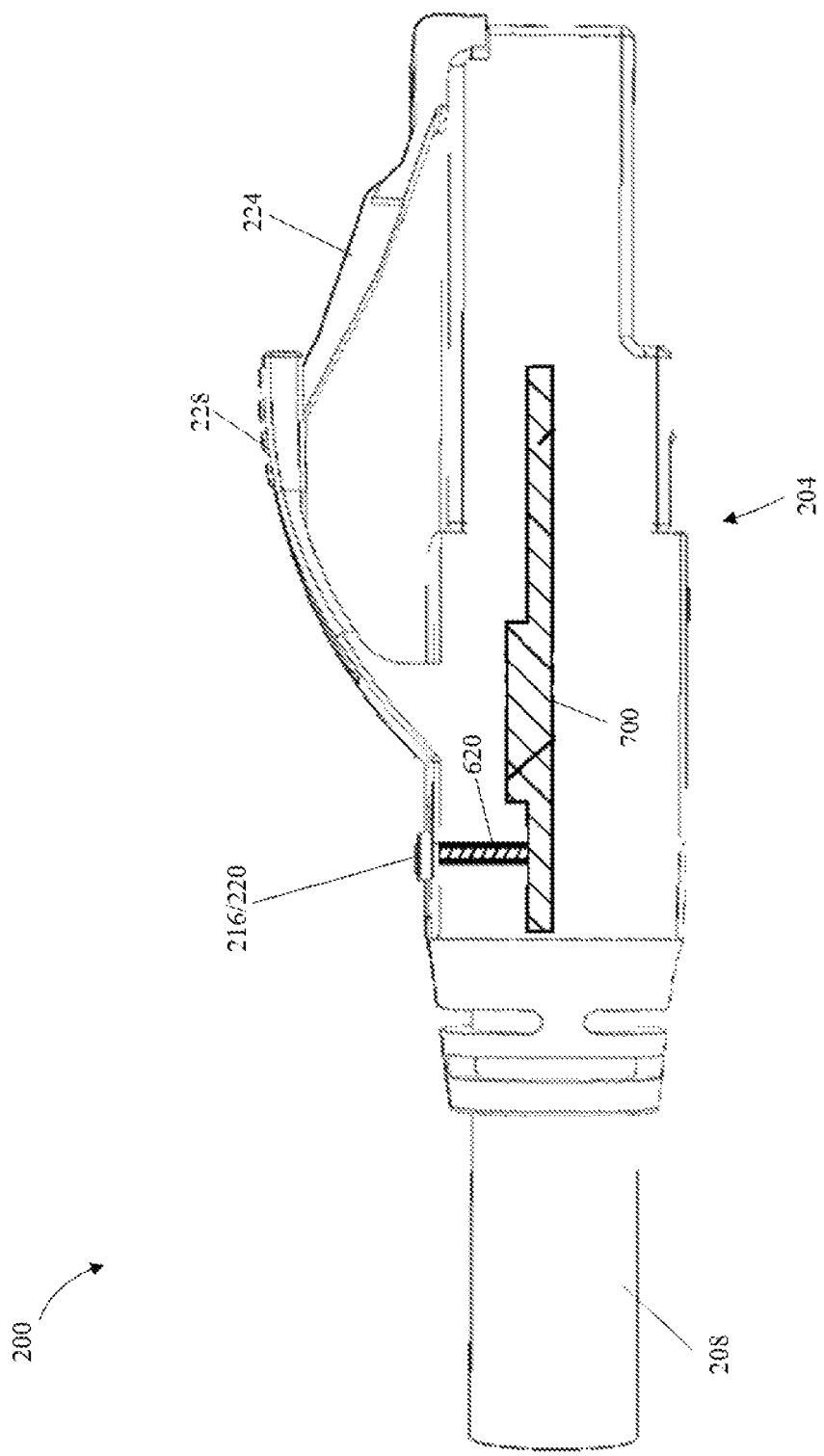
FIG. 6 illustrates a perspective view showing interior components of one end of a networking cable according to one aspect of the present disclosure.

FIG. 6 depicts a cross-sectional side view of networking cable 200 showing some internal components incorporated into the outline of the overall hood 204. In the embodiment shown, networking cable 200 comprises a circuit 700 (e.g., an integrated circuit) that may be disposed on a printed circuit board (PCB). A switch 620 is coupled to circuit 700 on one end and to button 220 on the other end. Switch 620 may operate as follows: when button 220 is pressed, a physical force is applied to switch 620 to turn the switch on or off, and an input signal (i.e., a signal that represents an input from the switch) is then send to integrated circuit 700. Different input signals could be generated by operating button 220 and therefore switch 620 in different patterns and sent to circuit 700. Further details of the input signals are described below in connection with FIG. 7.

Figure 7:
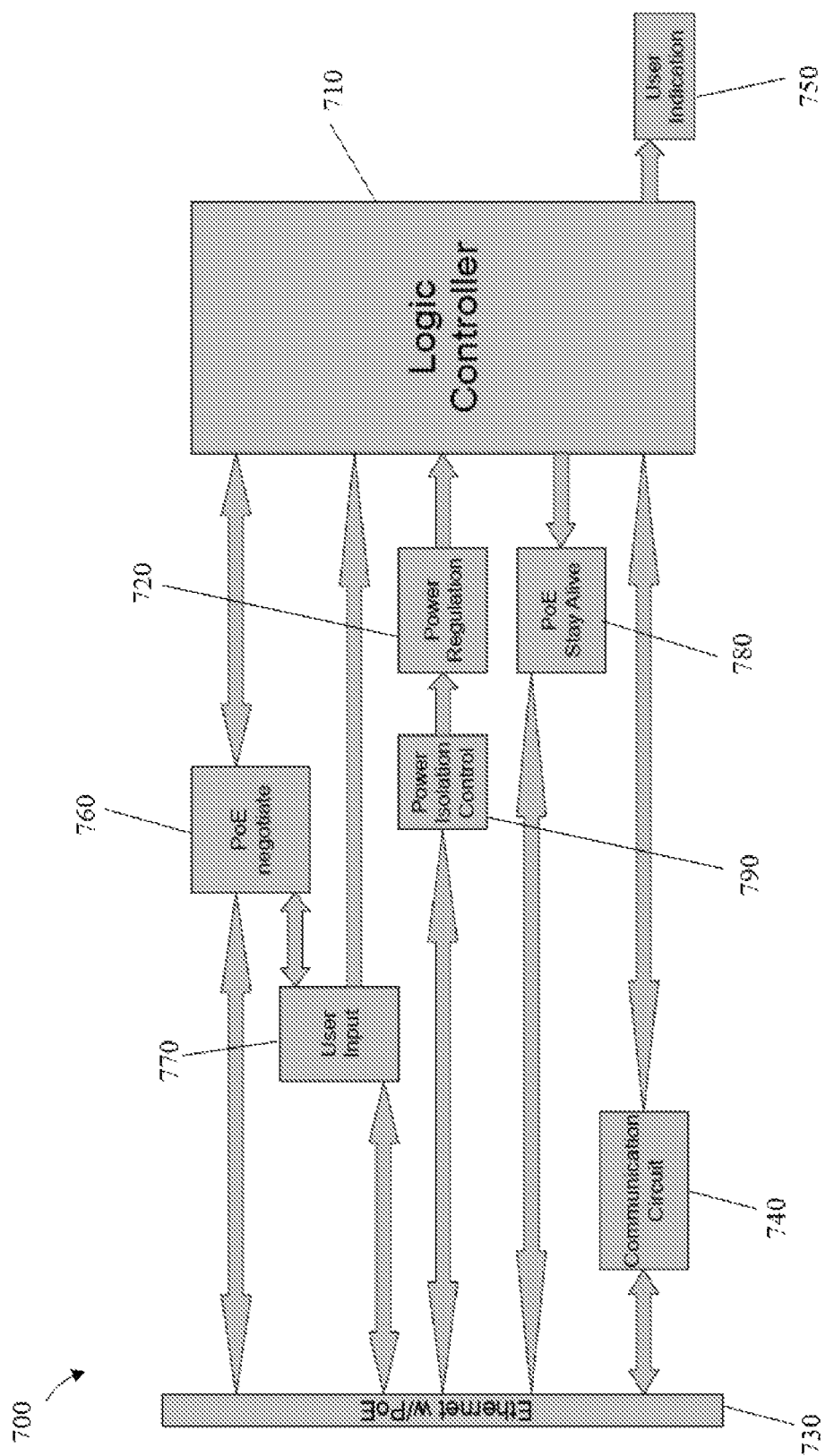
FIG. 7 illustrates a block diagram of a circuit incorporated into one end of a networking cable according to one aspect of the present disclosure.

FIG. 7 depicts a block diagram showing some components of integrated circuit 700. In the depicted embodiment, circuit 700 comprises a controller 710, a power regulator 720, a connection interface 730, a communication circuit 740, a user indication or telltale 750, a power negotiation circuit 760, a user input 770, a power drawing circuit or stay alive circuit 780, and a power isolation 790. In the embodiment shown, communication circuit 740, power negotiation circuit 760, user input 770, and power drawing circuit 780 are directly connected to controller 710 on one end, and directly connected to interface 730 on the other end. Power isolation 790 is directly connected to interface 730 and to power regulator 720, which is in turn connected to controller 710. User indication 750 is directly connect to controller 710. It should be noted that in some embodiments, circuit 700 may not include one or more of the components depicted in FIG. 7. It should also be noted that in some embodiments, the components of circuit 700 shown in FIG. 7 may be included in one or more separate circuits rather than in one single integrated circuit.

In an exemplary embodiment, components of circuit 700 may operate in the following manner. Circuit 700 (and thus cable 200) may be electrically connected to one or more cables that are substantially similar to cable 200 (e.g., a cable having a telltale and a circuit substantially similar to circuit 700), and to an electric power source such as a power-over-Ethernet (POE) power sourcing equipment (PSE). Circuit 700 receives an input signal through user input 770. The input signal may be generated by, e.g., pressing button 220 described above in a specified manner. If telltale 750 (e.g., a light emitting diode) was active before receiving the input signal, controller 710 may, upon receiving the input signal, inactivate telltale 750 or causes telltale 750 to operate in a different manner (e.g., to change from one color to another color, or to change from one blinking pattern to anther blinking pattern) depending on the input signal. If telltale 750 was inactive before receiving the input signal, the input signal received at user input may prompt power negotiate circuit 760 to request power from the POE PSE, and negotiate a power level (e.g., how much energy is required from the POE PSE) with the POE PSE. Power negotiation may or may not be conducted under the control of controller 710. The power negotiate circuit 760 may request power for telltale of circuit 700 and/or telltales included in other cables connected to circuit 700.

Once power negotiation is completed, the required level power is then supply from the POE PSE to circuit 700 (and other cables connected to cable 200) through power isolation 790. Power isolation 790 is configured to allow one-way power transmission, i.e., it allows electricity flows from the POE PSE into power regulator 720, but prevents electricity from flowing from power regulator 720 back to POE PSE. Power regulator 720 then converts income power from the POE PSE to a proper voltage (e.g., 4.5 volts) and supply the converted power to some other components of circuit 700, such as controller 710, telltale 750, and/or communication circuit 740. Controller then activates telltale 750, which in turn emits an activation signal (e.g., blinks an LED or light bulb, or emits a sound). When POE PSE starts to supply power to circuit 700, power drawing circuit 780 keeps drawing power from the PSE to maintain an active power connection between the PSE and circuit 700 so that the PSE will deliver electric power to circuit 700 even if the cable is not also electrically-connected to a separate POE-powered device (PD).

When user input 770 receives an input signal, circuit 700 (and thus cable 200) transits into a master mode and controller 710 sends one or more control signals through communication circuit 740 to all other cables connected to cable 200 and/or other circuits included in cable 200 (e.g., a circuit substantially similar to circuit 700 and incorporated in the other end of cable 200). The control signal causes other circuits included in cable 200 and/or other connected cables to operate in a slave mode. If telltale 750 was inactive before receiving an input signal through user input 770, control signals sent from controller 710 causes other telltales included in cable 200 and/or telltales included in other connected cables to be activated. If telltale 750 was active before receiving an input signal through user input 770, control signals sent from controller 710 may cause other telltales included in cable 200 and/or telltales included in other connected cables to be inactivated or cause those telltales to operate in a different manner (e.g., to change from one color to another color, or to change from one blinking pattern to anther blinking pattern) depending on the input signal.

When circuit 700 is not receiving an input signal through user input 770, communication circuit 740 may receive one or more control signals from another circuit included in cable 200 and/or from a circuit included in other connected cables. Upon receiving the control signals from other circuits, circuit 700 operates in a slave mode. If telltale 750 was inactive before receiving the control signals from other circuits, the control signals causes telltale 750 to be activated (e.g., by controller 710). If telltale 750 was active before receiving the control signals from other circuits, the control signals may cause telltale 750 to be inactivated or to operate in a different manner (e.g., to change from one color to another color, or to change from one blinking pattern to anther blinking pattern) depending on the received control signals.

When circuit 700 does not receive an input signal through user input 770 or any control signals from other circuits through communication circuit 740 after a predetermined amount of time (e.g., equal to or greater than 5, 10, 20, 30, 40, or 50 seconds), circuit 700 may transit into a sleep mode. In the sleep mode, circuit 700 is not receiving power (or only receiving a minimal amount of power) from a power source such as PSE and telltale 750 is not active. However, in the sleep mode, circuit 700 may still receive input signals through user input 770 or signals from other circuits through communication circuit 740.

Figure 8:
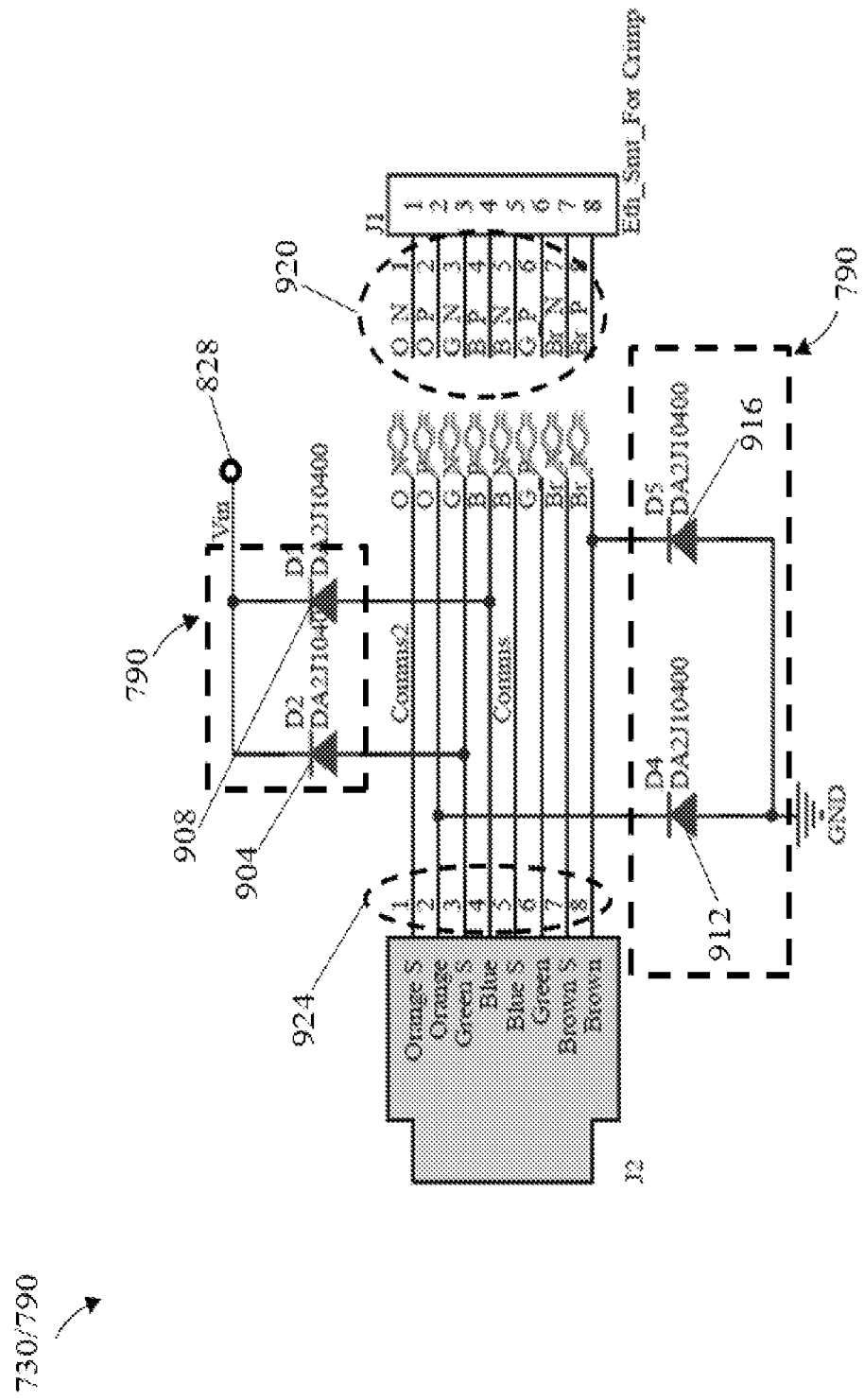
FIGS. 8-14 illustrate hardware implementation of various components of a circuit incorporated into one end of a networking cable according to one aspect of the present disclosure.
Figure 9:
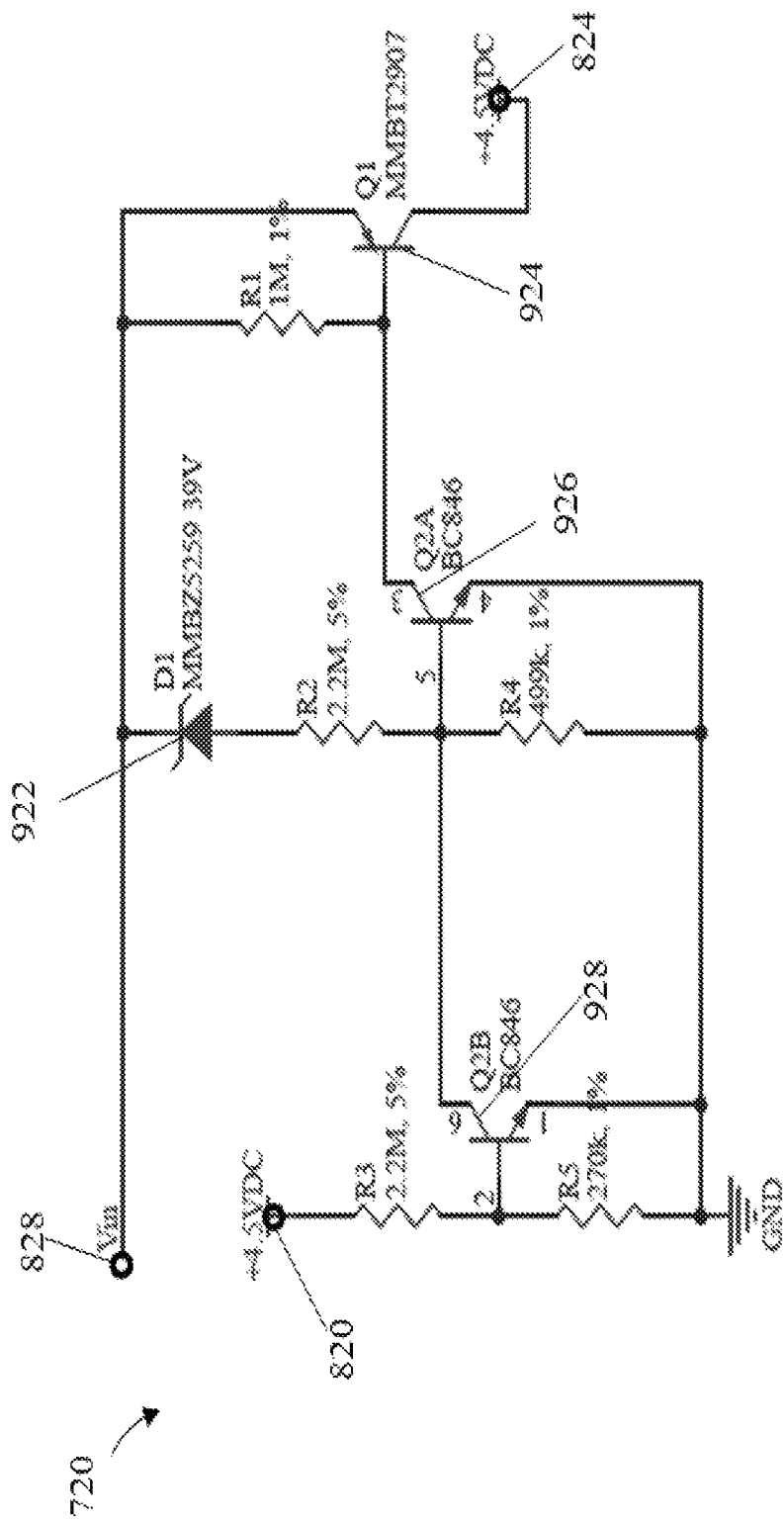
Figure 10:
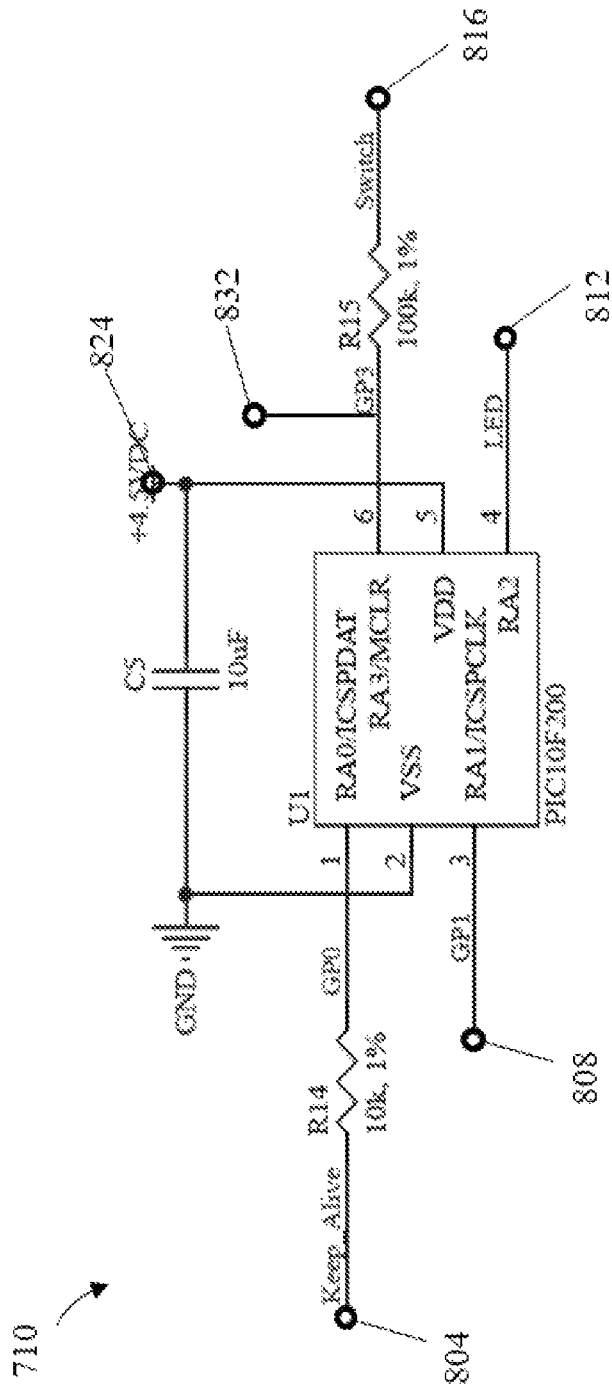
Figure 11:
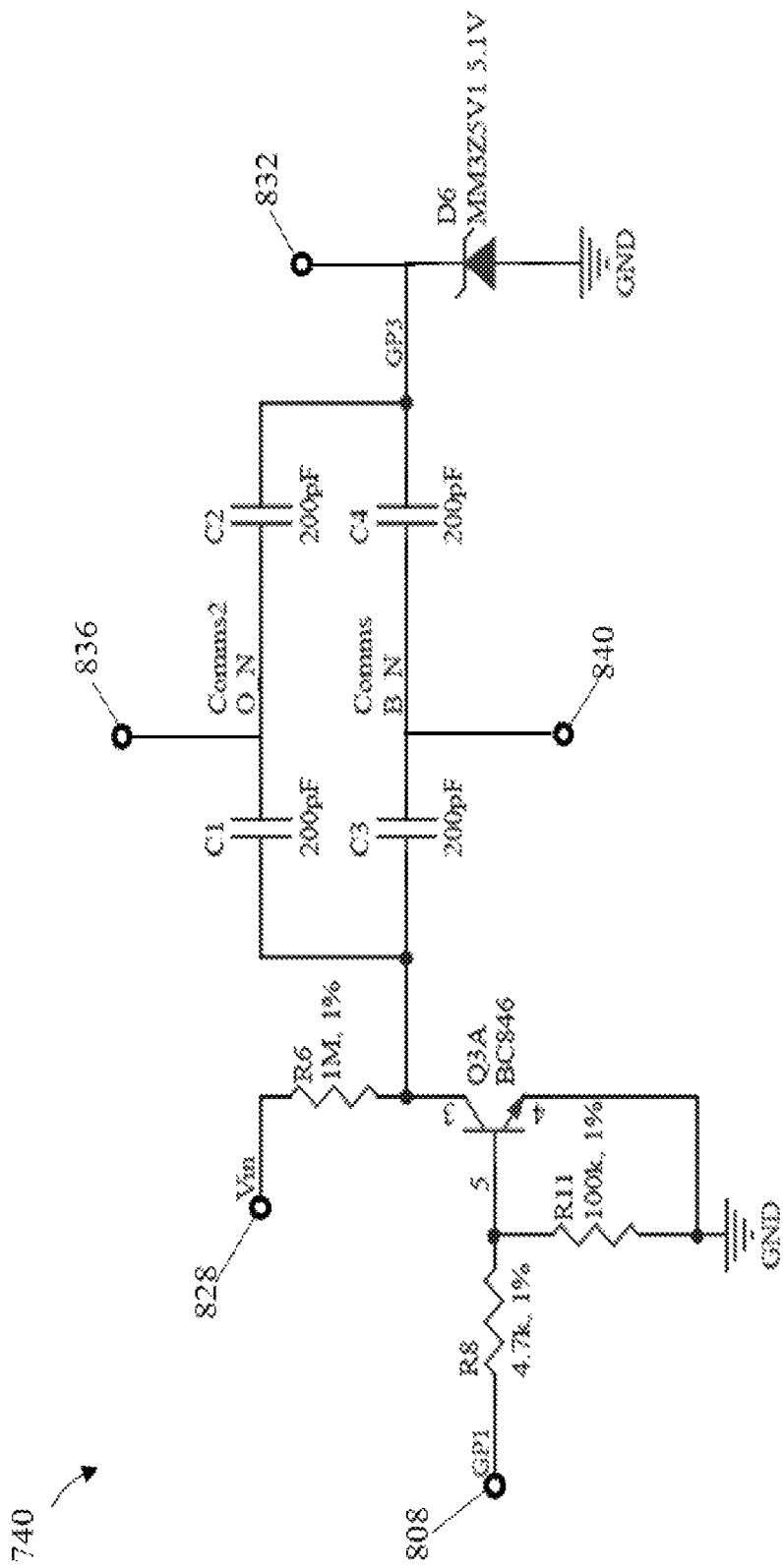

FIGS. 8-14 depict some examples of hardware implementation of certain components of circuit 700. FIG. 8 illustrates an example of hardware implementation of interface 730. In the depicted embodiment, interface 730 comprises a plurality of contact pins 920 (e.g., 8 pins for standard Ethernet connection) each configured to connect to one conductor wire (such as conductor wires included in a cable described above, e.g., Cat 5, 5e, 6, 6a cables etc.). In the example shown, 8 contact pins 920 are connected to 8 conductor wires 924, which are colored coded as: (e.g., orange strip, orange, green strip, blue, blue strip, green, brown stripe, and brown). Interface 730 may be connected to an electric power source, such as a power-over-Ethernet (POE) power sourcing equipment (PSE) through conductor wires 924. In some embodiments, interface 730 may be connected directly to a POE PSE without other intervening device or indirectly to the POE PSE through some intervening devices, such as another cable substantially similar to networking cable 200, a hub, a networking switch, etc. Power from an electric power source (such as a PSE) may be supplied to circuit 700 through one or more wires of conductor wires 924. For example, up to 4 conductor wires may be used to supply power to circuit 700 and 4 conductor wires may be used to for data communications on cable 200. In some embodiments, one or more conductor wires may be used to communicate signals to/from communication circuit 740. For example, conductor wire number 5 (color coded as blue strip) in shown in FIG. 11 may be connected to communication circuit 740 (e.g., through connecting point 836 as shown in FIG. 11) to communicate signals between circuit 700, and/or other circuits included in cable 200 or included in another able connected to cable 200, where the signals may be used, e.g., to activate or inactivate telltale 750, and/or to activate or inactivate other telltales in cable 200 and/or telltales of other cables connected to cable 200.

FIG. 8 also illustrates an example of hardware implementation for power isolation 790. In the depicted embodiment, power isolation 790 comprises one or more diodes 904, 908, 912, 916 (e.g., Shockley diodes) that allows electricity to flow in one direction but not in the other direction. For example, electricity may flow from conductor wires 3, 4 into diodes 904, 980 and output to connecting point 828, but not the other way around when the applied voltage is lower than a certain threshold (e.g., 36 volts).

FIG. 9 illustrates an example of hardware implementation for power regulator 720. In the depicted embodiment, power regulator 720 comprises a diode 922, one or more transistors 924, 926, 928, and one or more resistors connected transistors 924, 926, 928. Power isolator receives power from power isolation 790 through connecting point 828 and converts the incoming power (e.g., around 44-46 volts) to direct current (DC) power of certain voltage (e.g., 4.5 volts) and supply it to controller 710 through connecting point 820. Output from connecting point 820 may also be supplied back to power regulator 720 as feedback input.

FIG. 10 illustrates an example of hardware implementation for controller 710. In the depicted embodiment, controller 710 comprises a plurality of connecting points for connection with other components of circuit 700. For example, connecting point 824 may be connected to power regulator 720 to receive power from a power source; connecting point 832 may be connected to communication circuit 740 to receive signals from other controllers included in the same cable or other connected cables; and connecting point 808 may be connected to communication circuit 740 to send signals to other controllers included in the same cable or other connected cables. Further, controller 710 may be connected to power drawing circuit 780 through connecting point 804, to telltale 750 through connecting point 812, and to user input 770 through connecting point 816.

In various embodiments of the present cables, controller 710 can be configured to include various functions. In some embodiments, the controller is configured to: activate the telltale for a predetermined amount of time (e.g., equal to, greater than, or between any of: 10, 15, 20, or 30 seconds) responsive to the switch being operated if (or when) the telltale is not active; and inactivate (or stop activation of) the telltale responsive to the switch being operated if the telltale is activated (e.g., during the predetermined amount of time during which the telltale is activated). In some embodiments, the controller is configured to: activate the telltale for a first predetermined amount of time (e.g., equal to, greater than, or between any of: 10, 15, 20, or 30 seconds) responsive to the switch being operated in a first manner (e.g., depressed and released once) if the telltale is not active; and activate the telltale for a second predetermined amount of time (e.g., equal to, greater than, or between any of: 30, 40, 50, or 60 seconds) responsive to the switch being operated in a second manner (e.g., depressed and released twice within 2 seconds, depressed and held down for 2 seconds or more, etc.) if the telltale is not active. In such embodiments (in which the controller is configured to activate the telltale for one of two predetermined periods of time depending on the manner in which the switch is operated), the user indication circuit or telltale 750 may include multiple resistors (932), as described below in connection with FIG. 12.

In some embodiments, several options of operation may be provided for an end user. For example, controller 710 can be configured to activate the telltales to a) flash for 20 seconds responsive to a button being pushed once, and then shut off automatically, b) flash for 40 seconds responsive to a button being held down for 3 seconds, and then shut off automatically, c) shut off responsive to a button being pushed once on either end while the telltales are active, and d) flash indefinitely responsive to a button being pressed 3 times in a row, and shut off responsive to a button being pushed once.

FIG. 11 illustrates an example of hardware implementation for communication circuit 740. In the depicted embodiment, communication circuit 740 comprises one or more transistors, resistors, and capacitors. Communication circuit 740 is connected to a power source through connecting point 828 to receive power from the power source. Communication circuit 740 is also connected to one or more conductor wires (e.g., conductor wires number 1 and/or number 4 as shown in FIG. 8) through connecting points 836, 840 to communicate signals with other controllers included in the same cable or other connected cables. For example, a signal received from another controller may be communicated through one of connecting points 836, 840 and then fed into controller 710 through connecting point 832, and a signal to be transmitted to another controller is received from controller 710 through connecting point 808 and then transmitted to another controller through one of connecting points 836, 840.

Figure 12:
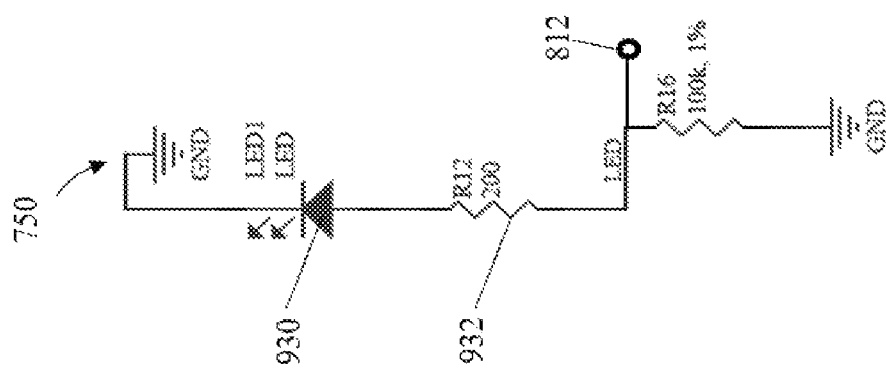

FIG. 12 illustrates an example of hardware implementation for telltale 750. In the depicted embodiment, telltale 750 comprises an LED 930 and a resistor 932. In some embodiments, the LED 930 of telltale 750 may be replaced by an incandescent or conventional light bulb, a liquid crystal visual indicator, or sound emitting device, etc. Telltale 750 may be connected to controller 710 through connecting point 812 and to power regulator 720 through connecting point 824. Resistor 932 is placed between LED 930 and connecting point 812, which is connected to controller 710. Resistor 932 may be configured to limit currents flowing through LED 930 and determines the maximum brightness of LED 930. Controller 710 may be configured to determine the frequency and duration of power pulses sent to LED 930.

Figure 13:
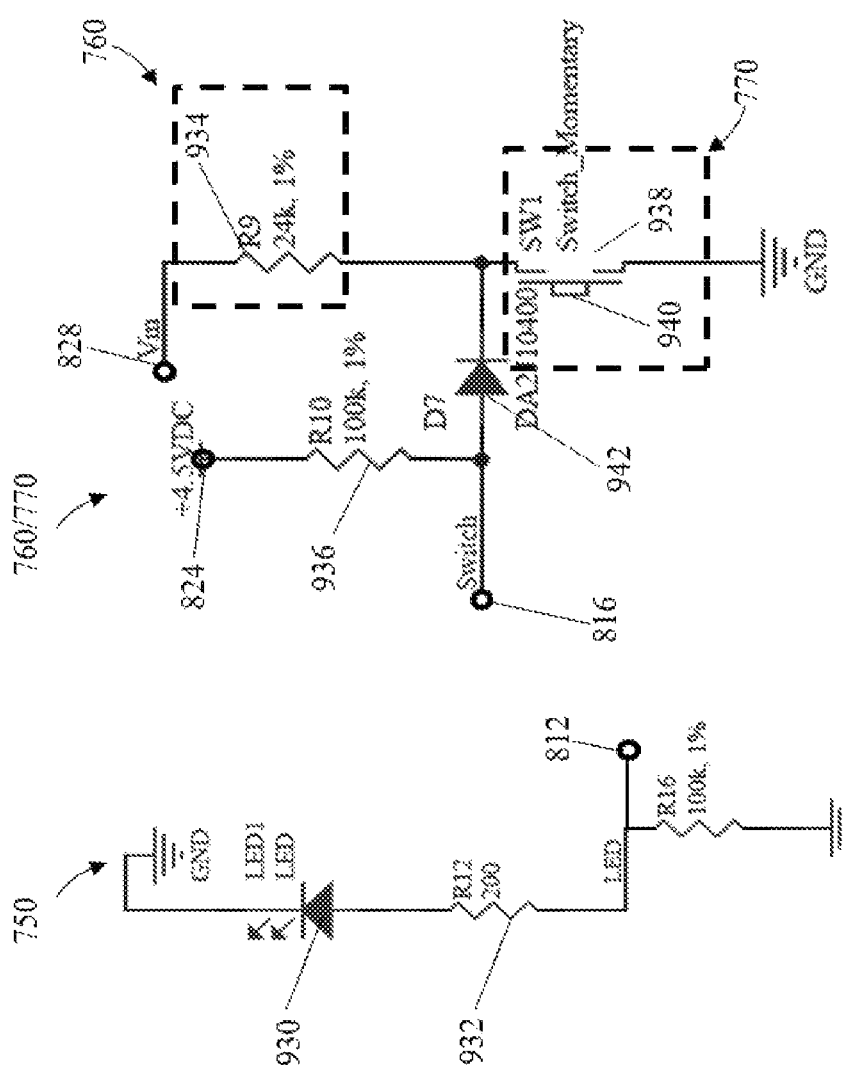

FIG. 13 illustrates an example of hardware implementation for power negotiate circuit 760. In the depicted embodiment, power negotiate 760 comprises at least a resistor 934. Resistor 934 can be of any suitable resistance (e.g., 24 kΩ or 25 kΩ) as required by one or more POE standards. POE delivery generally includes a "handshake" or initiation process with an exchange of signals between the PSE and a powered device (PD) in which the PSE verifies that the PD is standard compliant and determines the maximum amount of power to be delivered to the PD. Power negotiate circuit 760 is configured to initiate the handshake process with a PSE and request power for cable 200, and particularly for telltale 750. In some embodiments, when cable 200 is connected to one or more cables that are substantially similar to cable 200 (e.g., a circuit similar to circuit 700 with a telltale), power negotiate circuit 760 may negotiate power for other cables connected to cable 200.

FIG. 13 also illustrates an example of hardware implementation for user input 770. The combined power negotiate and user input unit is connected to power input from power isolation 790 through connecting point 828, to controller 710 through connecting point 816, and to power regulator 720 through connecting point 824. In the depicted embodiment, user input 770 comprises a switch 938 which includes a button 940. Different input signals could be generated by operating button 940 and therefore switch 938 in different patterns and sent to circuit 700. For example, if telltale 750 is not active, when button 940 is pressed once, a signal may be sent to circuit 700, which causes telltale 750 (e.g., by controller 710 sending a signal to telltale 750) to blink for a first predetermined amount of time (e.g., equal to, greater than, or between any of: 10, 15, 20, or 30 seconds) and/or light up in a first color (e.g., red, blue, purple, etc.); when button 940 is pressed and hold for X seconds (e.g., equal to or greater than 1, 2, 3, 4, or 5 seconds), a signal may be sent to circuit 700, which causes telltale 750 to blink for a second predetermined amount of time (e.g., equal to, greater than, or between any of: 10, 15, 20, or 30 seconds) and/or light up in a second color; when button 940 is pressed twice within a predetermined amount of time (e.g. equal to or greater than 0.5, 1, 2, 3, or 4 seconds), a signal may be sent to circuit 700, which causes telltale 750 to blink for a third predetermined amount of time (e.g., equal to, greater than, or between any of: 10, 15, 20, or 30 seconds) and/or light up in a third color. If telltale 216 is active, pressing button 940 may cause telltale 750 to turn off, or operate in a mode different from its previous operating mode. Button 940 and switch 938 may also be operated in other manners that cause the circuit 700 to perform other functions. For example, the operation of button 940 and switch 938 (e.g., in any of the manner described above) may cause networking cable 200 (e.g., through circuit 700) to send electrical signals to another cable or an electric power connected to cable 200.

In the depicted embodiment, user input 770 is connected to power regulator 720 (through connecting point 824) to controller 710 (through connecting point 816) via a resistor 936 and a diode 942. Resistor 936 may be configured to stabilize signals from user input 770 to controller 710. Diode 942 may be configured to separate input signals from user input 770 and input signals from communication circuit 740 to controller 710 so that controller 710 may receive input signals from these two sources at the same time.

Figure 14:
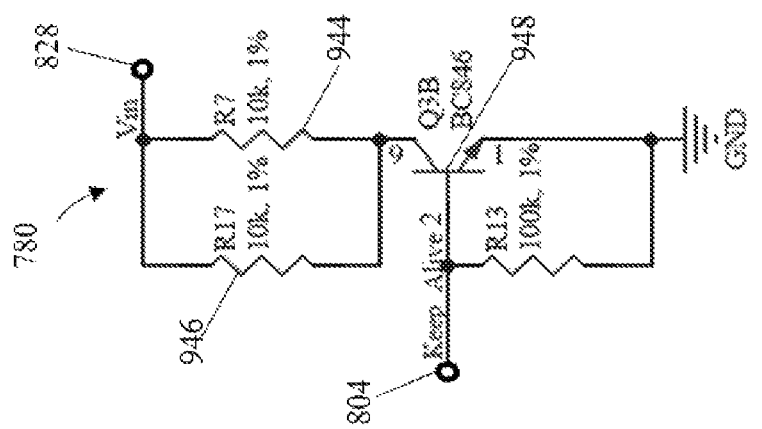

FIG. 14 illustrates an example of hardware implementation for power drawing circuit 780. Power drawing circuit 780 is connected to power input from power isolation 790 through connecting point 828, to controller 710 through connecting point 804. In the depicted embodiment, power drawing circuit 780 comprises at least a transistor 948 and a resistor 944. For POE, once the handshake between a PD and PSE is completed and the PSE begins delivering power to the PD, the PSE will stop delivering power to the PD if the PD stops drawing power for a predetermined period of time (e.g., 100 seconds). In some embodiments, cable 200 with the power drawing circuit 780 may be configured to demand POE power from a PSE even if the cable is not also electrically connected to a separate POE PD. For example, resistor 944 may be configured such that, when LED 930 is active, resistor 944 (or combined with LED 930) will consume an amount of power above the minimal power level from the PSE to ensure that the PSE does not stop delivering power to the cable. For example, cable 200 can be configured to demand an initial burst or relatively higher amount of power to set the maximum power level from the PSE relatively high (e.g., 1 W) and then maintain at least a minimal or relatively lower power demand (e.g., 0.01 W) continuously to ensure that the PSE does not stop delivering power to the cable. Alternatively, the cable can be configured to (e.g., after the handshake process) only demand power above the minimal power level from the PSE to ensure that the PSE does not stop delivering power to the cable. In some embodiments, cable 200 may comprise two substantially similar power drawing circuits (e.g., both having a transistor and a resistor), each incorporated into a connector hood on each end of cable 200. In these cases, the resistors in each power drawing circuit can be configured to draw power from the PSE such that the power withdrawal level is above the minimal power level from the PSE to ensure that the PSE does not stop delivering power to the cable.

When circuit 700 transitions into sleep mode, circuit 700 turns off all peripherals connected to it to draw no power from a PSE. Lines GP0 (connected to connecting point 804) and GP1 (connected to connecting point 808) shown in FIG. 10 are set to logic 0, and line GP3 is set to receive input signals only (i.e., signals are not transmitted by circuit 700 through line GP3 to another circuit) before circuit 700 transitions into sleep mode.

While circuit 700 is in sleep mode, circuit 700 is still physically connected to the PSE and is configured to draw a very small amount of current from the PSE (e.g., around 10 micro amps or lower). In effect, by dropping the current withdrawal from the PSE to a very small amount, circuit 700 tricks the PSE into thinking that circuit 700 has been disconnected, while in fact circuit 700 is still physically connected to the PSE. The low current withdrawal level for circuit 700 in sleep mode may be achieved by, e.g., using a low dropout regulator ("LDO") for power regulator 720 as shown in FIG. 9. In such embodiments, diode 922 of power regulator 720 may be configured to have a big voltage drop, and resistors of power regulator 720 may be configured to have high resistance. With such configurations, the ground current (i.e., the current that a device consumes even when there is no current flowing to a connected load) of power regulator 720 can be reduced to a very low level (e.g., less than 1 micro amps). Power negotiation 760 as shown in FIG. 13 may be also configured to have a low leakage current (e.g., less than 1 micro amps). Thus, the total effect of a low ground current for power regulator 720 and low leakage current of power negotiation 760 allows circuit 700 to have a very small current withdrawal level while in sleep mode.

It should be noted that the above configuration that allows very small current withdrawal level of circuit 700 in sleep mode also helps reduce the interference with the power negotiation with the PSE. For example, diode 922 of power regulator 720 may be configured to have an operating voltage higher than a PSE's probe voltages for power negotiation (around 2-24 volts). With such a configuration, diode 922 does not allow much current through during power negotiation with a PSE and thus reducing interference with the power negotiation process.

Figure 10A:
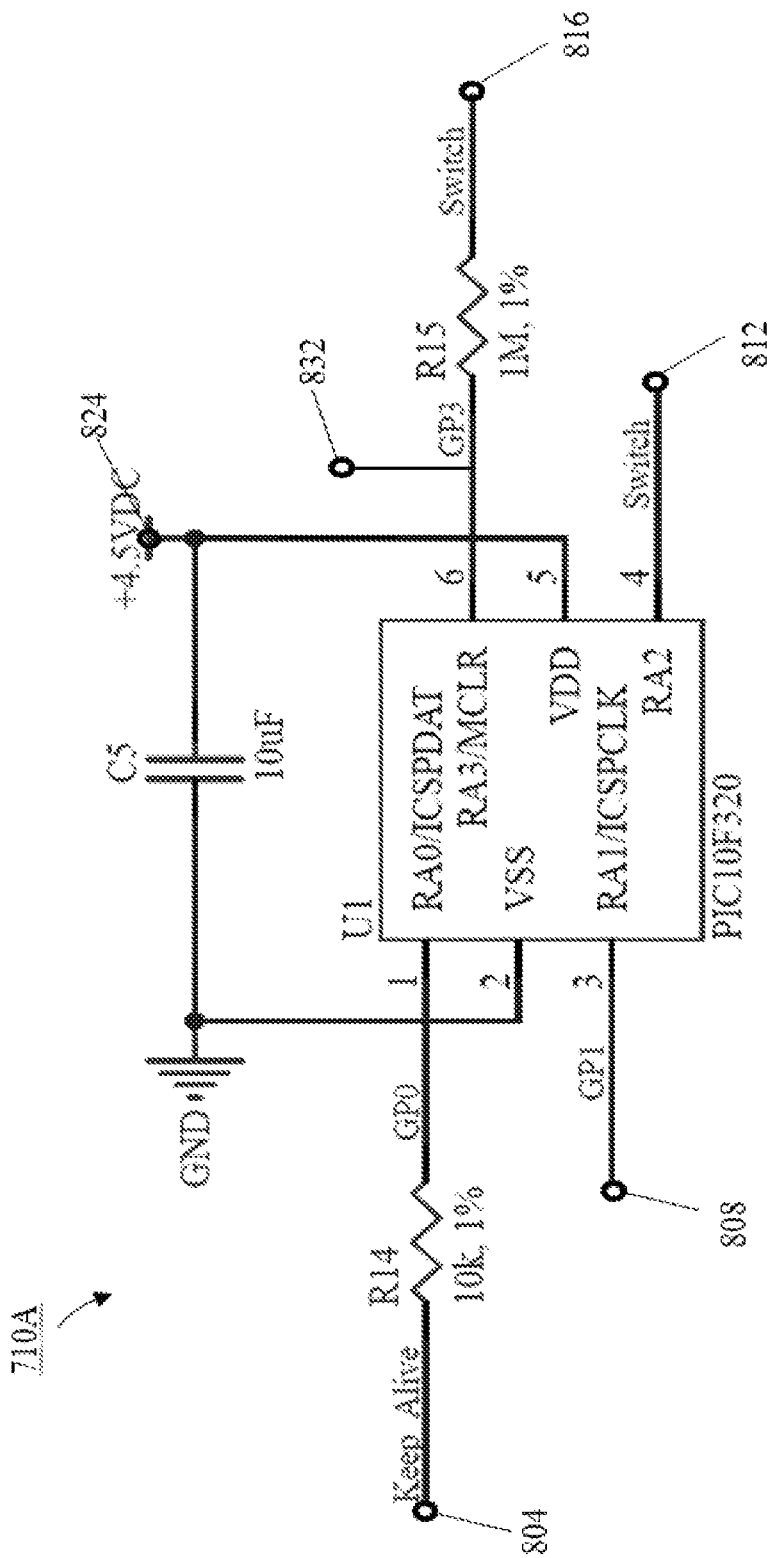

FIGS. 10A-13A depict some alternative examples of hardware implementations of certain components of circuit 700. FIG. 10A illustrates another example of hardware implementation for controller 710. In the depicted embodiment, controller 710A comprises a plurality of connecting points for connection with other components of circuit 700. For example, connecting point 824 may be connected to power regulator 720 to receive power from a power source; connecting points 812, 816 may be connected to one end of communication circuit 740A and connecting point 808 may be connected to another end of communication circuit 740A. Further, controller 710A may be connected to power drawing circuit 780 through connecting point 804, to telltale 750A through connecting point 808, and to user input 770A through connecting points 812, 816.

In various embodiments of the present cables, controller 710A can be configured to include various functions. In some embodiments, the controller is configured to: activate the telltale for a predetermined amount of time (e.g., equal to, greater than, or between any of: 10, 15, 20, or 30 seconds) responsive to the switch being operated if (or when) the telltale is not active; and inactivate (or stop activation of) the telltale responsive to the switch being operated if the telltale is activated (e.g., during the predetermined amount of time during which the telltale is activated). In some embodiments, the controller is configured to: activate the telltale for a first predetermined amount of time (e.g., equal to, greater than, or between any of: 10, 15, 20, or 30 seconds) responsive to the switch being operated in a first manner (e.g., depressed and released once) if the telltale is not active; and activate the telltale for a second predetermined amount of time (e.g., equal to, greater than, or between any of: 30, 40, 50, or 60 seconds) responsive to the switch being operated in a second manner (e.g., depressed and released twice within 2 seconds, depressed and held down for 2 seconds or more, etc.) if the telltale is not active. In such embodiments (in which the controller is configured to activate the telltale for one of two predetermined periods of time depending on the manner in which the switch is operated), the user indication circuit or telltale 750 may include multiple resistors (932), as described below in connection with FIG. 12A.

In some embodiments, several options of operation may be provided for an end user. For example, controller 710A can be configured to activate the telltales to a) flash for 20 seconds responsive to a button being pushed once, and then shut off automatically, b) flash for 40 seconds responsive to a button being held down for 3 seconds, and then shut off automatically, c) shut off responsive to a button being pushed once on either end while the telltales are active, and d) flash indefinitely responsive to a button being pressed 3 times in a row, and shut off responsive to a button being pushed once.

Figure 11A:
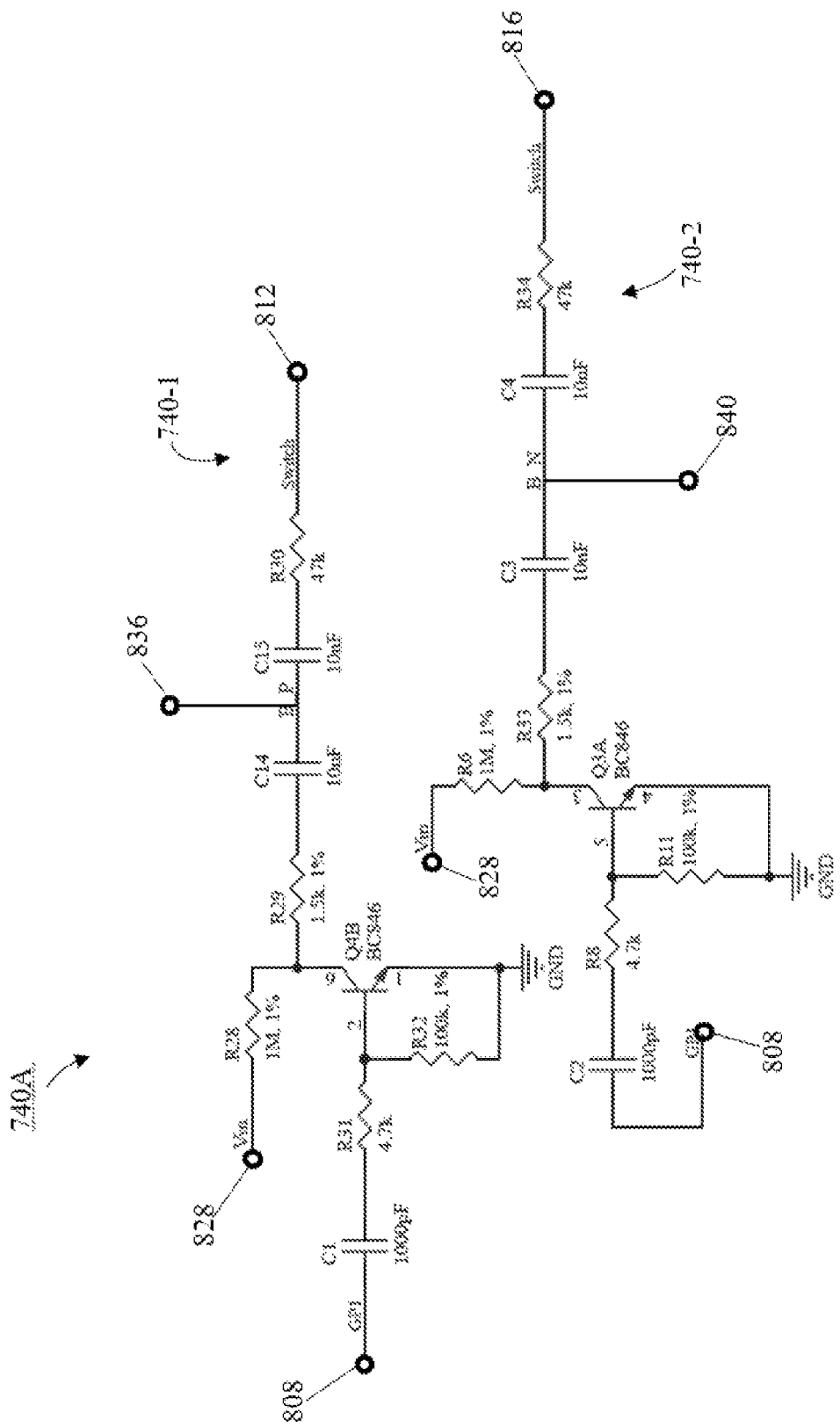

FIG. 11A illustrates another example of hardware implementation for communication circuit 740. In the depicted embodiment, communication circuit 740A comprises a first part 740-1 and a second part 740-2, each comprises one or more transistors, resistors, and capacitors. The first and second parts 740-1, 740-2 of communication circuit 740A may be connected to a power source through connecting points 828 to receive power from the power source. Communication circuit parts 740-1, 740-2 are connected to controller 710A through connecting point 808 on one end and are connected to controller 710A through connecting points 812, 816, respectively, on another end. It should be noted that in some embodiments, connecting points 812, 816 are interchangeable, i.e., in one embodiment, first part 740-1 is connected to controller 710A through connecting point 812 and second part 740-1 is connected to controller 710A through connecting point 816, but in another embodiment, first part 740-1 is connected to controller 710A through connecting point 816 and second part 740-1 is connected to controller 710A through connecting point 812.

First part 740-1 and second part 740-2 of communication circuit 740A are also connected to one or more conductor wires (e.g., conductor wires number 1 and/or number 4 as shown in FIG. 8) through connecting points 836, 840, respectively, to communicate signals with other controllers included in the same cable or other connected cables. The above setting configures communication circuit 740A to operate in a differential communication mode, where communication signals are sent and received as differential pairs through first and second parts 740-1, 740-2. Under the differential communication mode, signals from the differential communication pair cancel out each other and minimize their effect on other Ethernet data transmission on the conductive wires. In some embodiments, these signals can be a part of a common mode signal. During data transmission, an Ethernet system ignores common mode signals and/or changes because usually these signals are common mode noise signals that have undesirable effects on the data signals. In at least some such systems, a common mode signal will not interfere or conflict with Ethernet data transmission. In the embodiment shown, for example, a signal from controller 710A may be received by communication circuit 740A at connecting point 808, split into two parts, and communicated through connecting points 836, 840 to other controllers included in the same cable or other connected cables. Similarly, a signal received from another controller or other controllers may be communicated through one of connecting points 836, 840 and then fed into controller 710A through connecting points 812, 816. In the embodiment shown, connecting points 812, 816 are configured to output one signal component of a differential signal pair to controller 710A.

Figure 12A:
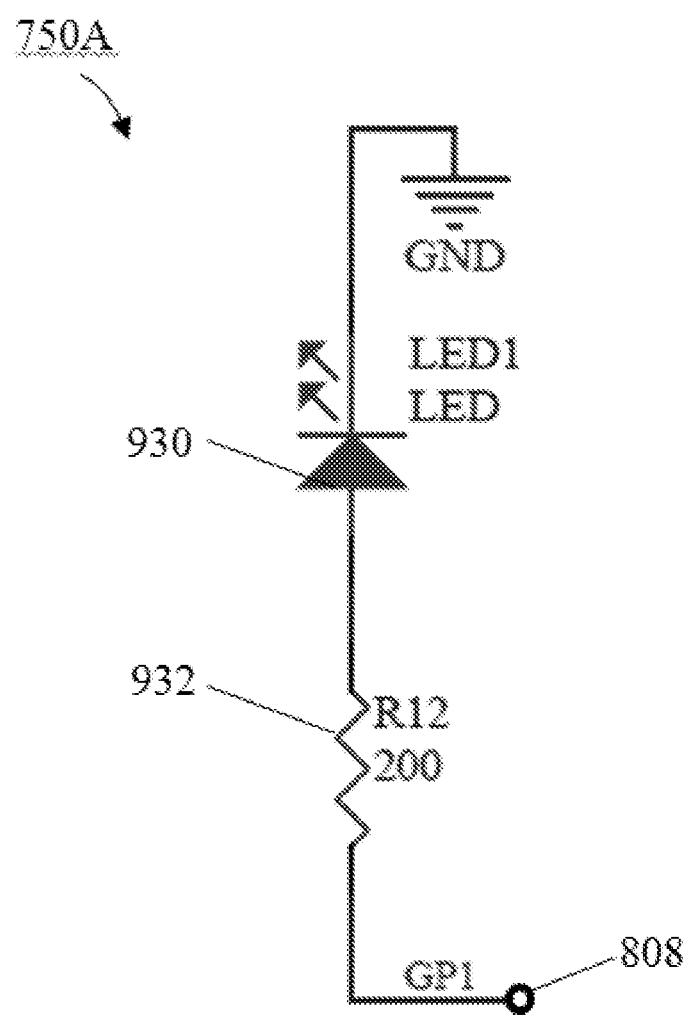

FIG. 12A illustrates another example of hardware implementation for telltale 750. In the depicted embodiment, telltale 750A comprises an LED 930 and a resistor 932. In some embodiments, the LED 930 of telltale 750A may be replaced by an incandescent or conventional light bulb, a liquid crystal visual indicator, or sound emitting device, etc. Telltale 750A may be connected to controller 710A through connecting point 808 and/or to power regulator 720 through connecting point 824. Resistor 932 is placed between LED 930 and connecting point 808, which is connected to controller 710A. Resistor 932 may be configured to limit currents flowing through LED 930 and determines the maximum brightness of LED 930. Controller 710A may be configured to determine the frequency and duration of power pulses sent to LED 930.

Figure 13A:
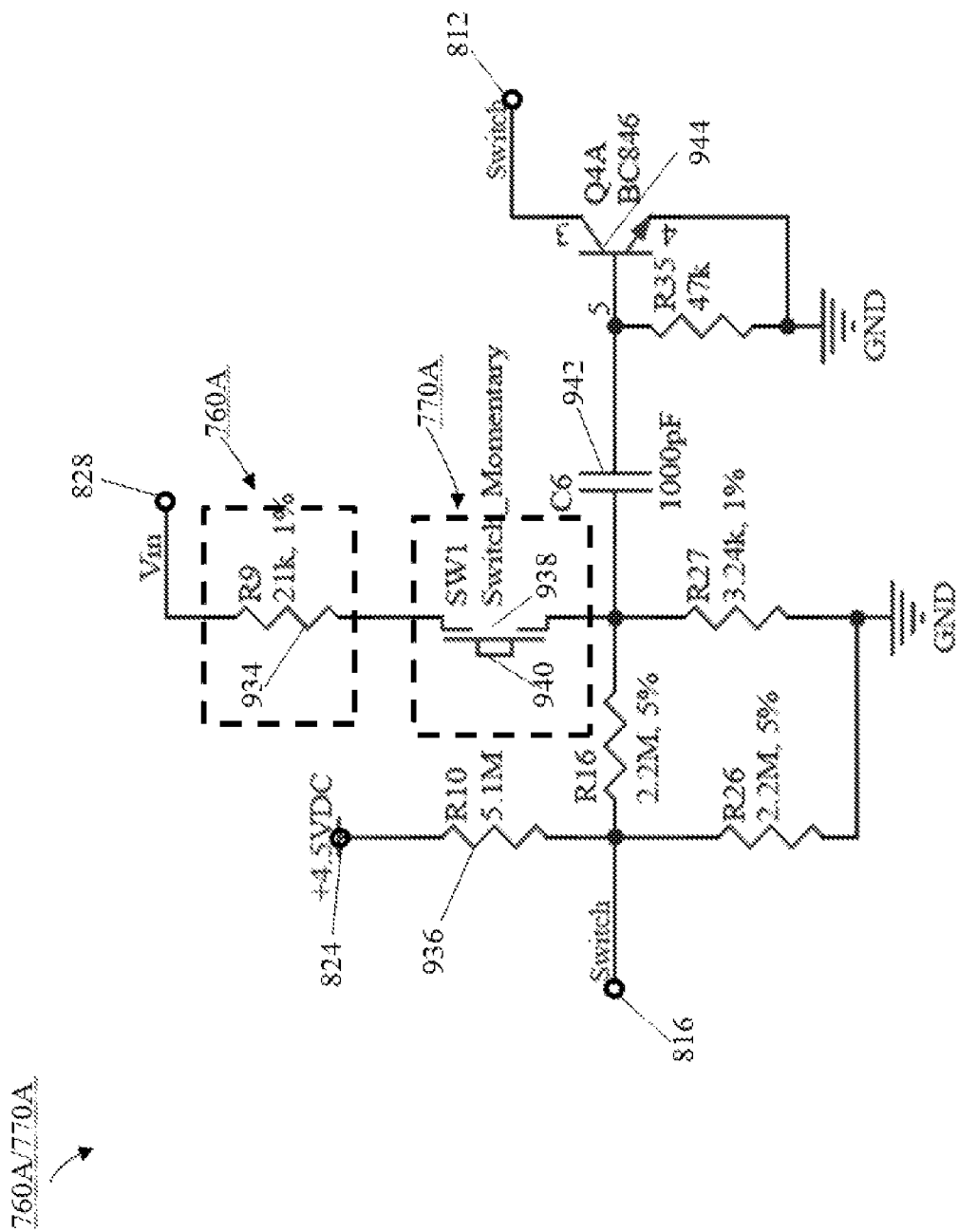

FIG. 13A illustrates another example of hardware implementation for power negotiate circuit 760. In the depicted embodiment, power negotiate 760A comprises at least a resistor 934. Resistor 934 can be of any suitable resistance (e.g., 21 k$\Omega$, 24 k$\Omega$ or 25 k$\Omega$) as required by one or more POE standards. POE delivery generally includes a "handshake" or initiation process with an exchange of signals between the PSE and a powered device (PD) in which the PSE verifies that the PD is standard compliant and determines the maximum amount of power to be delivered to the PD. Power negotiate circuit 760A is configured to initiate the handshake process with a PSE and request power for cable 200, and particularly for telltale 750A. In some embodiments, when cable 200 is connected to one or more cables that are substantially similar to cable 200 (e.g., a circuit similar to circuit 700 with a telltale), power negotiate circuit 760A may negotiate power for other cables connected to cable 200.

FIG. 13A also illustrates another example of hardware implementation for user input 770. The combined power negotiate and user input unit 770A is connected to power input through connecting point 828, to controller 710A through connecting points 812, 816, and to power regulator 720 through connecting point 824. In the depicted embodiment, user input 770A comprises a switch 938 which includes a button 940. Different input signals could be generated by operating button 940, and therefore switch 938, in different patterns and sent to circuit 700. For example, if telltale 750A is not active, when button 940 is pressed once, a signal may be sent to circuit 700, which causes telltale 750A (e.g., by controller 710 sending a signal to telltale 750A) to blink for a first predetermined amount of time (e.g., equal to, greater than, or between any of: 10, 15, 20, or 30 seconds) and/or light up in a first color (e.g., red, blue, purple, etc.); when button 940 is pressed and hold for X seconds (e.g., equal to or greater than 1, 2, 3, 4, or 5 seconds), a signal may be sent to circuit 700, which causes telltale 750 to blink for a second predetermined amount of time (e.g., equal to, greater than, or between any of: 10, 15, 20, or 30 seconds) and/or light up in a second color; when button 940 is pressed twice within a predetermined amount of time (e.g. equal to or greater than 0.5, 1, 2, 3, or 4 seconds), a signal may be sent to circuit 700, which causes telltale 750A to blink for a third predetermined amount of time (e.g., equal to, greater than, or between any of: 10, 15, 20, or 30 seconds) and/or light up in a third color. If telltale 216 is active, pressing button 940 may cause telltale 750A to turn off, or operate in a mode different from its previous operating mode. Button 940 and switch 938 may also be operated in other manners that cause the circuit 700 to perform other functions. For example, the operation of button 940 and switch 938 (e.g., in any of the manner described above) may cause networking cable 200 (e.g., through circuit 700) to send electrical signals to another cable or an electric power connected to cable 200.

In the depicted embodiment, user input 770A is connected to power regulator 720 (through connecting point 824) to controller 710A (through connecting points 812, 816) via a resistor 936, a capacitor 942, and a transistor 944. Resistor 936 may be configured to stabilize signals from user input 770A to controller 710. Capacitor 942 may be configured to separate input signals from user input 770A and input signals from communication circuit 740 to controller 710 so that controller 710A may receive input signals from these two sources at the same time. In some embodiment, transistor 944 may allow controller 710A to detect user input through switch 938 in various cases, including when the cable is already powered by a PD device via POE and needs to wake up to become a master device (e.g., by adjusting the strength of the signal generated by pressing button 940).

Figure 15:
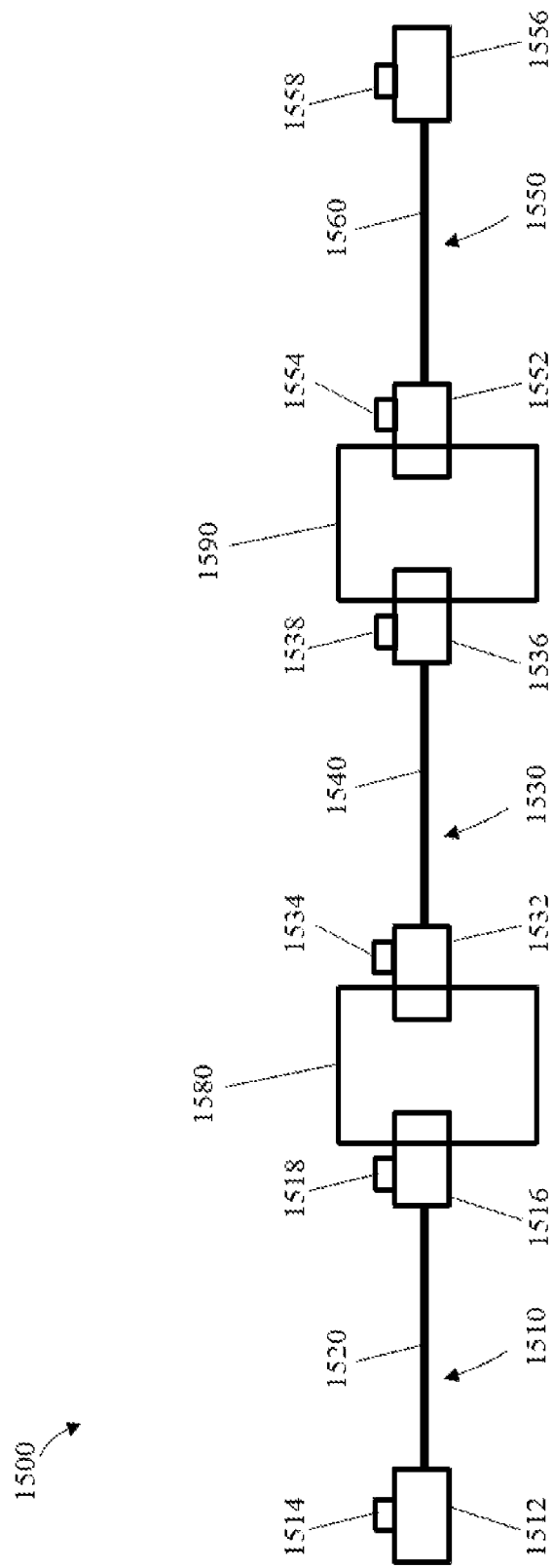
FIG. 15 illustrates a block diagram of a system with multiple networking cables connected to each other according to one aspect of the present disclosure.

FIG. 15 depicts a block diagram showing a system 1500 where multiple networking cables are electrically interconnected. In the depicted embodiment, system 1500 may comprise networking cables 1510, 1530, 1550, each may be substantially similar to networking cable 200 described above. Cable 1510 comprises a first connector 1512 with a telltale/switch 1514 on one end and second connector 1516 with a telltale/switch 1518 on the other end, where the two connectors are connected by one or more conductor wires 1520 (which may be wrapped under a flexible sheath). Similarly, cable 1530 comprises a first connector 1532 with a telltale/switch 1534 on one end and second connector 1536 with a telltale/switch 1538 on the other end, where the two connectors are connected by one or more conductor wires 1540 which may be wrapped under a flexible sheath); and cable 1550 comprises a first connector 1552 with a telltale/switch 1554 on one end and second connector 1556 with a telltale/switch 1558 on the other end, where the two connectors are connected by one or more conductor wires 1560 which may be wrapped under a flexible sheath). Each of connectors 1512, 1516, 1532, 1536, 1552, and 1556 may comprise (e.g., incorporated in the connector hoods) an integrated circuit substantially similar to circuit 700 (having at least a controller) described above in connection with FIGS. 7-14 or the connectors may comprise one or more circuits that performs substantially the same function as circuit 700.

In the depicted embodiment, cable 1510 is connect to cable 1530 via a panel 1580, and cable 1530 is in turned connected to cable 1550 via panel 1590. Panels 1580, 1590 may be any type of connectors configured to electrically connect two more cables, such as a hub, a networking switch, etc. In one embodiment, system 1500 may be electrically connected to a POE PSE using the spare end of cable 1510 (e.g., through connector 1512) and/or to an electronic device (such as a desktop computer, laptop computer, server, printer, scanner, etc.) using the spare end of cable 1550 (e.g., through connector 1556). When cables 1510, 1530, 1550 are electrically connected, telltales 1514, 1518, 1534, 1538, 1554, 1558 may operate in a substantially similar manner at a given time period. For example, telltales 1514, 1534, 1554 may be all inactive, all active and flashing in a specific mode (e.g., flashes in red or blue, or alternates between read and blue), and/or all transition into another operating mode at substantially the same time (e.g., from active to inactive or vice versa or flashing in blue to flashing in red, etc.).

When cables 1510, 1530, 1550 are electrically connected to a POE PSE, system 1500 may function as follows. If telltales 1514, 1518, 1534, 1538, 1554, 1558 are inactive, actuating any one of the telltales (e.g., by pressing a switch connected to the telltale, such as described above) of telltales 1514, 1518, 1534, 1538, 1554, 1558 may activate all other telltales. For example, pressing a switch (e.g., switch 940 in FIG. 13, which is part of user input 770 in FIG. 7) connected to telltale 1514 will send an input signal to a controller (such as controller 710 in FIG. 7). After receiving the input signal, the controller activates telltale 1514, and sends one or more signals (e.g., through a communication circuit such as circuit 740 in FIG. 7) via conductor wires to all other connected controllers on the same cable and other connected cables, i.e., controllers incorporated in connectors 1516, 1532, 1536, 1552, 1556. The signals sent from connector 1512 then causes controllers at connectors 1516, 1532, 1536, 1552, 1556 to active the respective telltale incorporated in the connector (i.e., telltales 1514, 1518, 1534, 1538, 1554, 1558). In this example, pressing the switch connected to telltale 1514 and sending an input signal to a controller incorporated in connector 1512 causes the controller to operate in a master mode, and causes controllers incorporated in connectors 1516, 1532, 1536, 1552, 1556 to operate in slave mode (i.e. the controller of connector 1512 sends one or more signals to other controllers incorporated in connectors 1516, 1532, 1536, 1552, 1556 to control the operation of telltales incorporated in these connectors).

After telltales 1514, 1518, 1534, 1538, 1554, 1558 are activated, pressing the switch connected to any one of these telltales will cause the corresponding controller to operation in a master mode and other controllers to operation in a slave mode, and/or change the operation manner of these telltales. For example, when telltales 1514, 1518, 1534, 1538, 1554, 1558 are active, pressing the switch connected to telltale 1538 will send an input signal to controller incorporated in connector 1536, and the controller will operate in a master mode and send one or more signals to controllers incorporated in connectors 1512, 1516, 1532, 1552, 1556 (which will be operating in a slave mode). The signals from controller of connector 1536 can change the operation manner of telltales 1514, 1518, 1534, 1538, 1554, 1558 (e.g., the signals may inactivate the telltales or cause the telltales from flashing in red to flashing in blue, etc., depending on the input signal sent to controller of connector 1536).

If none of the switches connected to telltales 1514, 1518, 1534, 1538, 1554, 1558 are pressed (thus no input signals to any of the controllers) after a predetermined amount of time (e.g., equal to or greater than 10, 15, 20, 30 or 40 seconds), all telltales may transition into a sleep mode. In the sleep mode, the telltales are inactive, but any of the controllers incorporated in the connectors may still receive an input signals from a switch connected to the controller or signals from other controllers.

The schematic flow chart diagrams that follow are generally set forth as logical flow chart diagrams. As such, the depicted order and labeled steps are indicative of some of the present embodiments. Other steps and methods may be employed that vary in some details from the illustrated embodiment (e.g., that are equivalent in function, logic, and/or effect). Additionally, the format and symbols employed are provided to explain logical steps and should be understood as non-limiting the scope of an invention. Although various arrow types and line types may be employed in the flow chart diagrams, they should be understood as non-limiting the scope of the corresponding method. Indeed, some arrows or other connectors may be used to indicate only the logical flow of the method. For instance, an arrow may indicate a waiting or monitoring period of unspecified duration between enumerated steps. Additionally, the order in which a particular method occurs may or may not strictly adhere to the order of the corresponding steps shown.

It should also be noted that in some embodiments, the methods described below may not comprise every step set in the following flow charts. Rather, in some embodiments, the method described below may comprise a subset of the steps set forth in the flow charts and the steps may be in a different order than the order presented in the flow charts.

Figure 16:
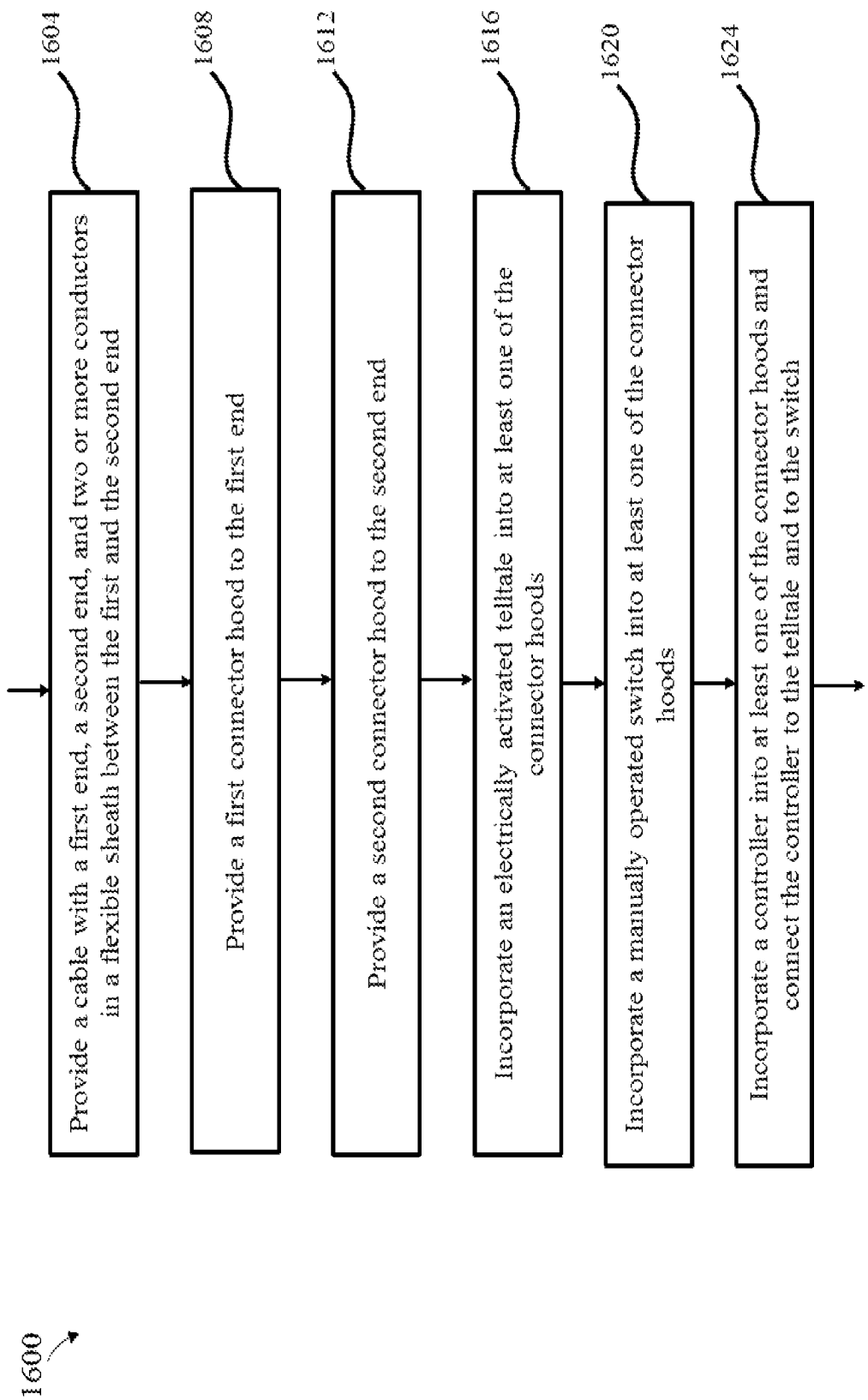
FIGS. 16-17 illustrate flow charts for a method for making a networking cable according to one aspect of the present disclosure.

Referring now to FIG. 16, depicted is a method 1600 for making a networking cable according to one aspect of the disclosure. In the depicted embodiment, step 1604 provides a cable with a first end, a second end, and two or more conductors in a flexible sheath between the first and the second end. The conductors may be any conductor wires described above in connection with FIGS. 1-6 (e.g., conductors compatible with the Ethernet category 3, 5, 5e, 6, 6a, 7 standards). At step 1608, a first connector hood is provided to the first end; and at step 1608, a second connector hood to the second end. The first and/or second connector hoods may be substantially similar to connector hood 204 described above in connection with FIGS. 2A-6 (e.g., have a connector such as RJ-45 or RJ-50 coupled to a boot).

At step 1616, an electrically activated telltale is incorporated into at least one of the connector hoods. The electrically activated telltale may be substantially similar to telltale 216 described above in connection with FIGS. 2A-6 (e.g., the telltale may be a LED, a light bulb, or a sound emitting device). At step 1620, a manually operated switch is incorporated into at least one of the connector hoods. The manually operated switch may be substantially similar to switch 220 described above in connection with FIGS. 2A-6 and may be incorporated into the same connector hood as the telltale.

At step 1624, a controller is incorporated into at least one of the connector hoods (the controller may be incorporated into the same or different connector hood as the telltale and/or the switch), and the controller is electrically connected to the telltale and the switch. The controller may be substantially similar to controller 710 described above in connection with FIGS. 7 and 10, and may be configured to perform substantially similar functions as controller 710. For example, the controller may be configured to: receive various input signals from the switch, where the various input signals may be generated by pressing the switch in different patterns (e.g., press once, press and hold, press twice, etc.); activate or inactivate or change the operating mode of one or more telltales of the cable; send a signal to a controller of another cable connected to the cable to activate or inactivate or change the operating mode of one or more telltales of the another cable; and/or receive a signal from a controller of another cable connected to the cable to activate or inactivate or change the operating mode of one or more telltales of the cable.

Figure 17:
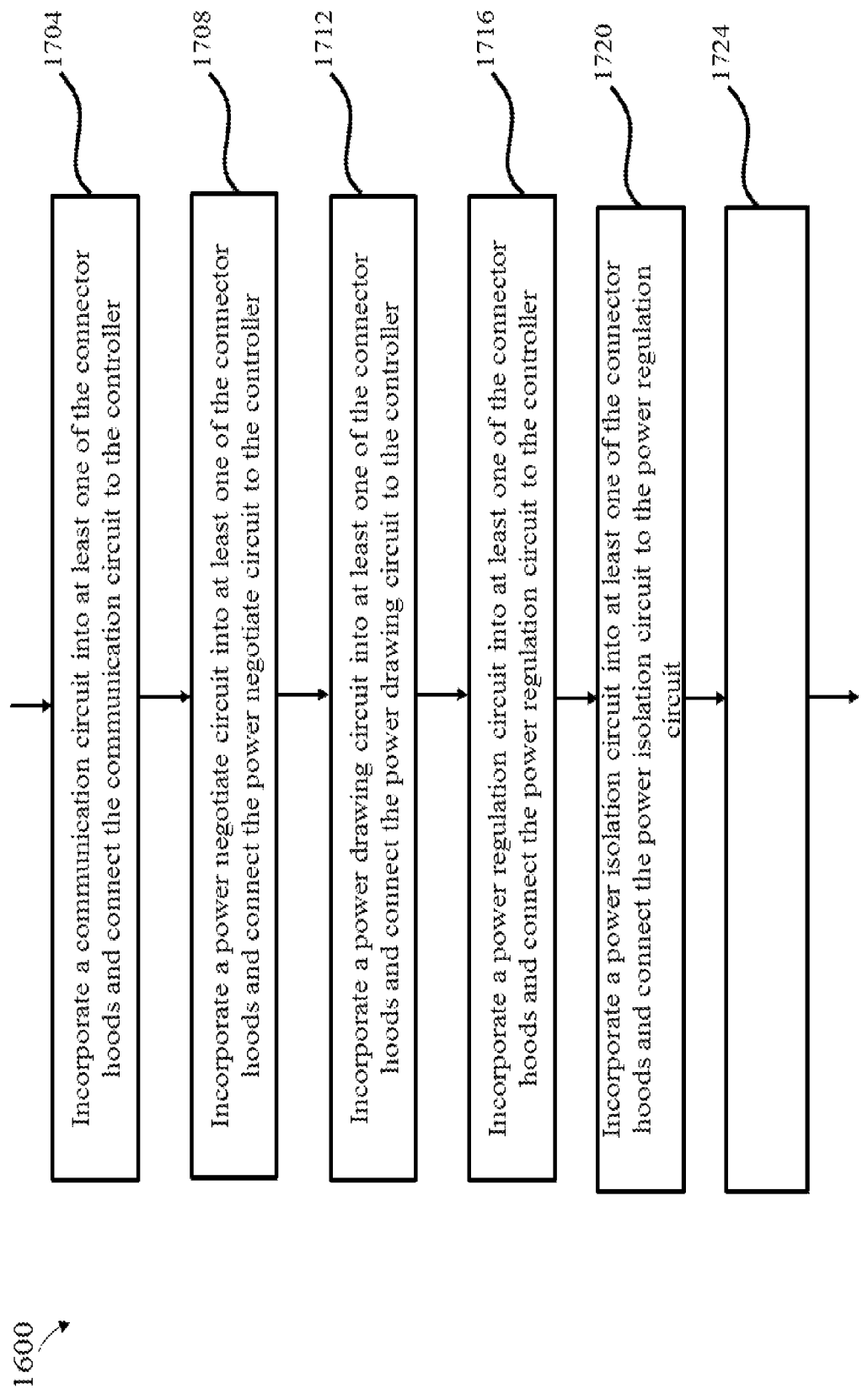

FIG. 17 depicts some additional steps of method 1600. For example, at step 1704, a communication circuit is incorporated into at least one of the connector hoods and is connected to the controller. The communication circuit may be substantially similar to communication circuit 740 described above in connection with FIGS. 7 and 13, and may be configured to perform substantially similar functions as communication circuit 740. For example, the communication circuit may be configured to: send a signal to the controller to another controller of another cable connected to the cable; and/or receive a signal from another controller of another cable connected to the cable and relay the signal to the controller. At step 1708, a power negotiate circuit is incorporated into at least one of the connector hoods and is connected to the controller. The power negotiate circuit may be substantially similar to power negotiate circuit 760 described above in connection with FIGS. 7 and 11, and may be configured to perform substantially similar functions as power negotiate circuit 760. For example, the power negotiate circuit may be configured to request power from a power source (such as a POE PSE) for the telltale, other telltales of the cable, and/or other telltales of another cable connected to the cable.

At step 1712, a power drawing circuit is incorporated into at least one of the connector hoods and is connected to the controller. The power drawing circuit may be substantially similar to power drawing circuit 780 described above in connection with FIGS. 7 and 114, and may be configured to perform substantially similar functions as power drawing circuit 780. For example, the power negotiate circuit may be configured to draw a level of power from a POE PSE connected to the cable that is equal or greater than the minimum level of power required so that the POE PSE will not stop providing power to the cable. At step 1716, a power regulation circuit is incorporated into at least one of the connector hoods and is connected to the controller. The power regulation circuit may be substantially similar to power regulator 720 described above in connection with FIGS. 7 and 9, and may be configured to perform substantially similar functions as power regulator 720. For example, the power regulation circuit may be configured to convert the power received from a power source (such as a POE PSE) and convert the power to a proper form (e.g., at a certain voltage) and provide the power to the controller. At step 1720 a power isolation circuit is incorporated into at least one of the connector hoods and is connected to the power regulation circuit. The power isolation circuit may be substantially similar to power isolation circuit 790 described above in connection with FIGS. 7 and 8, and may be configured to perform substantially similar functions as power isolation circuit 790. For example, the power isolation circuit may be configured to allow power from a power source to flow to the power regulation circuit but not in the other direction.

In some embodiments, two or more components of the controller, communication circuit, power negotiate circuit, power drawing circuit, power regulation circuit, and power isolation circuit are integrated into an integrated circuit.

Figure 18:
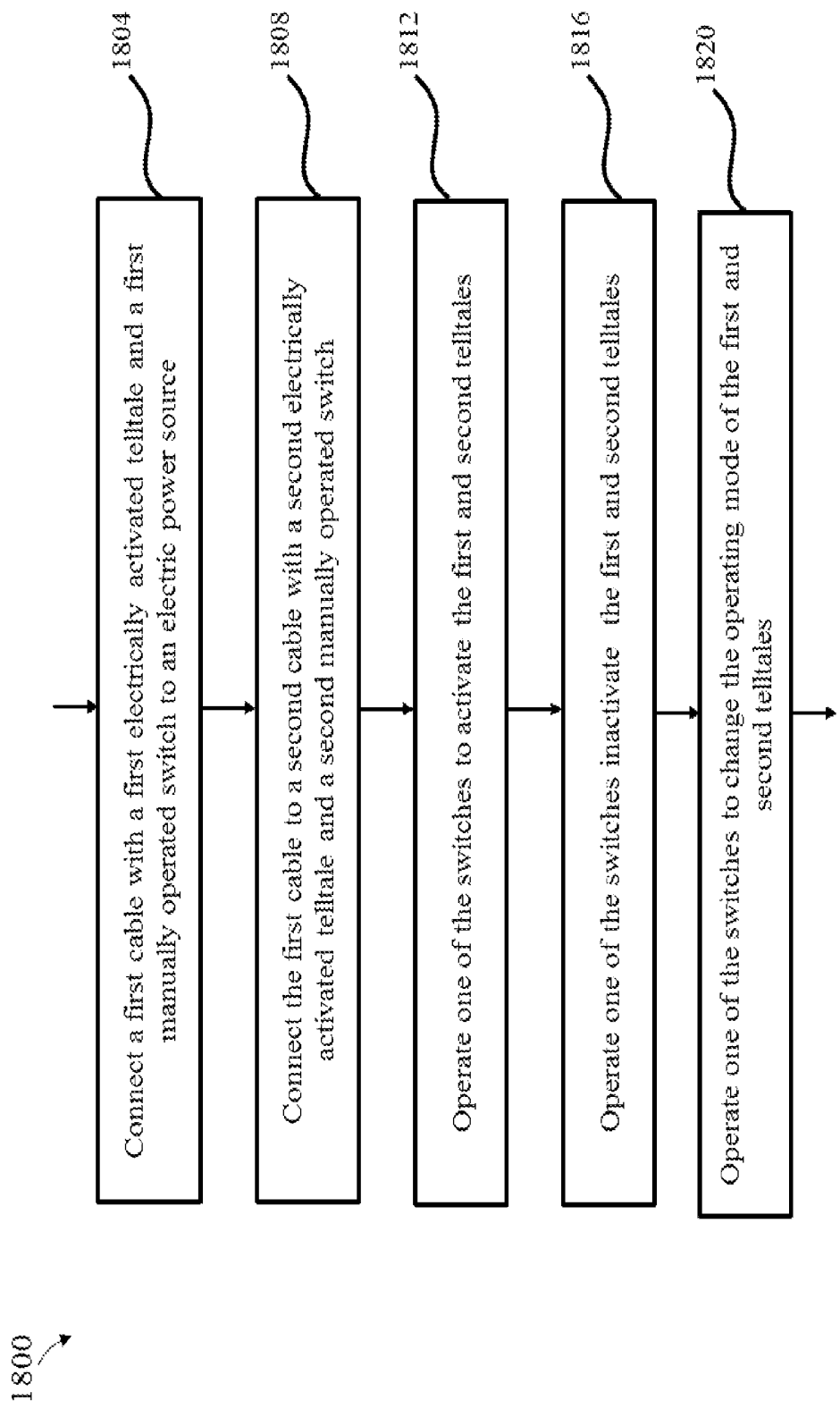
FIG. 18 illustrates a flow chart for operating a networking cable according to one aspect of the present disclosure.

FIG. 18 depicts one embodiment of a method 1800 for operating a cable according to one aspect of the current disclosure. In the depicted embodiment, at step 1804, a first cable with a first electrically activated telltale and a first manually operated switch is connected to an electric power source. The first cable may be substantially similar to cable 200 described above, and may be configured to perform substantially similar functions as cable 200. The electric power source may be a POE PSE or a different type of power source. At step 1808, the first cable is connected to a second cable with a second electrically activated telltale and a second manually operated switch. The second cable may be substantially similar to cable 200 described above, and may be configured to perform substantially similar functions as cable 200.

Step 1812 operates one of the switches to activate the first and second telltales. Step 1816 one of the switches inactivate the first and second telltales. Step 1820 operates one of the switches to change the operating mode (e.g., flashing in one color and/or pattern to flashing in another color and/or pattern) of the first and second telltales. The activation, inactivation, and/or changing operating mode of the telltales may be performed with the assistance of a controller (such as controller 710 described above) and/or other circuits (such as one or more circuits described in circuit 700 in connection with FIG. 7). The operation of a switch one cable may cause the cable to operate in a master mode (in which the cable controls the other cable) and cause the other cable to operate in a slave mode. Any of the switches may be operated in multiple manners to control the telltales to operate in different modes such as described above. For example, the switch may be: pressed once, pressed twice during a predetermined time, pressed and hold, etc.

The above specification and examples provide a complete description of the structure and use of exemplary embodiments. Although certain embodiments have been described above with a certain degree of particularity, or with reference to one or more individual embodiments, those skilled in the art could make numerous alterations to the disclosed embodiments without departing from the scope of this invention. As such, the various illustrative embodiments of the present devices are not intended to be limited to the particular forms disclosed. Rather, they include all modifications and alternatives falling within the scope of the claims, and embodiments other than the one shown may include some or all of the features of the depicted embodiment. For example, components may be combined as a unitary structure (e.g., connector 206 and boot 212 may be formed as a unitary piece). Further, where appropriate, aspects of any of the examples described above may be combined with aspects of any of the other examples described to form further examples having comparable or different properties and addressing the same or different problems. Similarly, it will be understood that the benefits and advantages described above may relate to one embodiment or may relate to several embodiments.

The claims are not intended to include, and should not be interpreted to include, means-plus- or step-plus-function limitations, unless such a limitation is explicitly recited in a given claim using the phrase(s) "means for" or "step for," respectively.

The invention claimed is:

1. A cable comprising:
    a first end and a second end, and two or more conductors in a flexible sheath between the first and the second end;
    a first connector hood on the first end;
    a second connector hood on the second end;
    an electrically activated telltale incorporated into at least one of the connector hoods;
    a manually operated switch incorporated into at least one of the connector hoods;
    where the cable is configured to electrically connect to an additional cable comprising an additional electrically activated telltale;
    where the switch is configured to activate the telltale and the additional telltale of the additional cable by initiating communications between an electric power source, at least one of the two or more conductors, and the telltale; and
    where the cable is configured to receive an electric signal from the additional cable, the telltale of the cable configured to be activated based on receiving the electric signal from the additional cable.

2. The cable of claim 1, further comprising:
    a communication circuit configured to send an electric signal to the additional cable responsive to the switch being operated, the signal when received by the additional cable causes the additional telltale being activated; and
    wherein:
        the communication circuit is configured to receive the electric signal from the additional cable, and
        electric signals are communicated between the cable and the additional cable through at least one of the two or more conductors.

3. The cable of claim 1, where:
    the electric power source is a power-over-Ethernet (POE) power sourcing equipment (PSE), the POE PSE will deliver power to the cable through at least one of the two or more conductors when the telltale is activated; and
    the telltale is configured to emit a visual or audio signal if activated.

4. The cable of claim 1, further comprising:
    a second electrically activated telltale incorporated into the other of the connector hoods; and
    where the switch is configured to activate both telltales of the cable by initiating electrical communication between the electric power source, at least one of the conductors, and the telltale.

5. The cable of claim 3, further comprising:
    a POE circuit incorporated into at least one of the connector hoods and configured to request power for the cable from the POE PSE; and
    wherein:
        the POE circuit comprises at least a resistor; and
        the POE circuit is electrically connected to the manually operated switch and is configured to receive an input from the manually operated switch and, in response to the input, request power for the telltale and the additional telltale from the POE PSE.

6. The cable of claim 5, where the POE circuit is configured to:
    request power from the POE PSE for a predetermined amount of time responsive to the switch being operated if the telltale is not active; and
    terminate power from the POE PSE responsive to the switch being operated during a predetermined amount of time during which the telltale is activated.

7. The cable claim 5, where the POE circuit is configured to:
    request power from the POE PSE for a first predetermined amount of time responsive to the switch being operated in a first manner if the telltale is not active; and
    request power from the POE PSE for a second predetermined amount of time responsive to the switch being operated in a second manner if the telltale is not active.

8. The cable of claim 5, further comprising:
    a signal shielding mechanism configured to shield other electrical signals from interfering with the POE circuit when the POE circuit is requesting power from the POE PSE
    a controller electrically coupled to the electric power source, the switch, and the telltale; and
    wherein:
        the controller is electrically connected to the POE circuit,
        the controller is configured to send a first signal to the POE circuit, the first signal, when received at the POE circuit, causing the POE circuit to request power from the POE PSE; and
    the controller is configured to send a second signal to the POE circuit, the second signal, when received at the POE circuit, causing the POE circuit to terminate power from the POE PSE.

9. The cable of claim 1, further comprising:
    a circuit incorporated into at least one of the connector hoods and configured to maintain a power connection between the electric power source and the telltale after the telltale is activated, where the circuit comprises at least a resistor and a transistor.

10. A system comprising:
    an electric power source;
    a first cable comprising:
        a first end and a second end, and two or more conductors in a flexible sheath between the first and the second end, a first connector hood on the first end,
a second connector hood on the second end,
an electrically activated telltale incorporated into at least one of the connector hoods, and
a manually operated switch incorporated into at least one of the connector hoods;
a second cable comprising a second electrically activated telltale;
a controller incorporated into at least one of the connector hoods of the first cable;
where the first cable is configured to electrically connect to the second cable;
where the switch of the first cable is configured to activate the telltale of the first cable and the second telltale of the second cable by initiating communications between the electric power source, at least one of the two or more conductors, and the telltales; and
where the controller is configured to operate in a first mode when the first cable receives a signal from the second cable, the electrically activated telltale of the first cable configured to activate based on the controller being in the first mode.

11. The system of claim 10, further comprising:
a controller incorporated into at least one of the connector hoods; and
wherein:
the controller is further configured to:
activate the telltale for a predetermined amount of time responsive to the switch being operated if the telltale is not active,
inactivate the telltale responsive to the switch being operated during a predetermined amount of time during which the telltale is activated, and
send a second signal to a power-over-Ethernet (POE) circuit, the signal, when received at the POE circuit, causing the POE circuit to request power from a POE power sourcing equipment (PSE).

12. The system of claim 10, further comprising:
a controller incorporated into at least one of the connector hoods;
a regulating circuit electrically connected to the electric power source and the controller, the regulating circuit configured to convert power from the electric power source to a voltage suitable for the controller; and
wherein:
the controller is further configured to:
activate the telltale for a first predetermined amount of time responsive to the switch being operated in a first manner if the telltale is not active; and
activate the telltale for a second predetermined amount of time responsive to the switch being operated in a second manner if the telltale is not active.

13. The system of claim 10, wherein:
the controller is further configured to:
operate the cable in a second mode when the switch is actuated and cause the cable to send a signal to the second cable to activate the second electrically telltale of the second cable, and
operate in a third mode when the cable does not receive an input from the switch or the second cable after a predetermined amount of time.

14. A cable comprising:
a first end and a second end, and two or more conductors in a flexible sheath between the first and the second end;
a first connector hood on the first end;
a second connector hood on the second end;
an electrically activated telltale incorporated into at least one of the connector hoods;
a manually operated switch incorporated into at least one of the connector hoods and configured to activate the telltale by initiating communications between an external electric power source, at least one of the two or more conductors, and the telltale;
a circuit incorporated into at least one of the connector hoods and configured to maintain a power connection between the external electric power source and the telltale after the telltale is activated, where the circuit comprises at least a resistor and a transistor;
a communication circuit configured to send an electric signal to a second cable responsive to the manually operated switch being operated, a second telltale of the second cable configured to activate based on receiving the electric signal; and
where the communication circuit is configured to receive a second electric signal from the second cable, the telltale of the cable configured to be activated based receiving the second electric signal.

15. The cable of claim 14, further comprising:
a second electrically activated telltale incorporated into the other of the connector hoods; and
wherein:
the external electric power source is a power-over-Ethernet (POE) power sourcing equipment (PSE), the POE PSE will deliver power to the cable through at least one of the two or more conductors when the telltale is activated;
the switch is configured to activate both telltales of the cable by initiating electrical communication between the external electric power source, at least one of the conductors, and the telltale; and
the telltale is configured to emit a visual or audio signal if activated.

16. The cable of any of claim 15, further comprising:
a second electrically activated telltale incorporated into the other of the connector hoods;
a POE circuit incorporated into at least one of the connector hoods and configured to request power for the cable from a POE PSE; and
wherein:
the POE circuit comprises at least a resistor, and
the POE circuit is electrically connected to the manually operated switch and is configured to receive an input from the manually operated switch and, in response to the input, request power for the telltale and the second telltale from the POE PSE.

17. The cable of claim 16, where the POE circuit is configured to:
request power from the POE PSE for a predetermined amount of time responsive to the switch being operated if the telltale is not active; and
terminate power from the POE PSE responsive to the switch being operated during a predetermined amount of time during which the telltale is activated.

18. The cable of claim 16, where the POE circuit is configured to:
request power from the POE PSE for a first predetermined amount of time responsive to the switch being operated in a first manner if the telltale is not active; and
request power from the POE PSE for a second predetermined amount of time responsive to the switch being operated in a second manner if the telltale is not active.

19. The cable of claim 16, further comprising:
a signal shielding mechanism configured to shield other electrical signals from interfering with the POE circuit when the POE circuit is requesting power from the POE PSE;
a controller electrically coupled to the external electric power source, the switch, and the telltale; and
wherein:
   the controller is electrically connected to the POE circuit,
   the controller is configured to send a first signal to the POE circuit, the first signal, when received at the POE circuit, causing the POE circuit to request power from the POE PSE; and
   the controller is configured to send a second signal to the POE circuit, the second signal, when received at the POE circuit, causing the POE circuit to terminate power from the POE PSE.

20. The cable of claim 14, further comprising:
an additional cable comprising an additional electrically activated telltale; and
where:
   the manually operated switch is configured to activate the additional telltale of the additional cable by initiating communication between the external electric power source, at least one of the two or more conductors, and the additional telltale, and
   electric signals are communicated between the cable and the additional cable through at least one of the two or more conductors.

* * * * *